(12) United States Patent
Holly et al.

(10) Patent No.: US 10,547,159 B1
(45) Date of Patent: Jan. 28, 2020

(54) LATERALLY TAILORING CURRENT INJECTION FOR LASER DIODES

(71) Applicant: Trumpf Photonics Inc., Cranbury, NJ (US)

(72) Inventors: Carlo Holly, Princeton, NJ (US); Stefan Heinemann, Hightstown, NJ (US); Suhit Ranjan Das, West Windsor, NJ (US); Prasanta Modak, East Windsor, NJ (US)

(73) Assignee: Trumpf Photonics Inc., Cranbury, NJ (US)

( * ) Notice: Subject to any disclaimer, the term of this patent is extended or adjusted under 35 U.S.C. 154(b) by 0 days.

(21) Appl. No.: 16/217,331

(22) Filed: Dec. 12, 2018

(51) Int. Cl.
| | | |
|---|---|---|
| *H01S 5/00* | (2006.01) | |
| *H01S 5/042* | (2006.01) | |
| *H01S 5/06* | (2006.01) | |
| *H01S 5/40* | (2006.01) | |
| *H01S 5/20* | (2006.01) | |
| *H01S 5/30* | (2006.01) | |

(Continued)

(52) U.S. Cl.
CPC .......... *H01S 5/0424* (2013.01); *H01S 5/0607* (2013.01); *H01S 5/20* (2013.01); *H01S 5/2059* (2013.01); *H01S 5/2068* (2013.01); *H01S 5/305* (2013.01); *H01S 5/3077* (2013.01); *H01S 5/4031* (2013.01); *H01S 5/3013* (2013.01); *H01S 5/3018* (2013.01); *H01S 5/323* (2013.01); *H01S 5/327* (2013.01); *H01S 5/343* (2013.01)

(58) Field of Classification Search
CPC ........ H01S 5/0607; H01S 5/20; H01S 5/4031; H01S 5/2059; H01S 5/2068; H01S 5/0424; H01S 5/3013; H01S 5/3018; H01S 5/305; H01S 5/3077; H01S 5/323; H01S 5/327; H01S 5/343
See application file for complete search history.

(56) References Cited

U.S. PATENT DOCUMENTS

| | | | | |
|---|---|---|---|---|
| 5,193,098 A | * | 3/1993 | Welch | H01S 5/20 372/46.015 |
| 5,343,487 A | * | 8/1994 | Scott | H01S 5/18333 372/45.01 |

(Continued)

OTHER PUBLICATIONS

Kräutle et al., Laser-Induced Doping of GaAs, Applied Physics A, 1985, 38: 49-56.

(Continued)

*Primary Examiner* — Kinam Park
(74) *Attorney, Agent, or Firm* — Fish & Richardson P.C.

(57) ABSTRACT

A semiconductor laser diode includes multiple layers stacked along a first direction, in which the multiple layers include: a first multiple of semiconductor layers; an optical waveguide on the first multiple of semiconductor layers, in which the optical waveguide includes a semiconductor active region for generating laser light, and in which the optical waveguide defines a resonant cavity having an optical axis; and a second multiple of semiconductor layers on the optical waveguide region, in which a resistivity profile of at least one layer of the multiple layers varies gradually between a maximum resistivity and a minimum resistivity along a second direction extending orthogonal to the first direction, in which a distance between the maximum resistivity and the minimum resistivity is greater than at least about 2 microns.

29 Claims, 12 Drawing Sheets

(51) Int. Cl.
  *H01S 5/323*  (2006.01)
  *H01S 5/343*  (2006.01)
  *H01S 5/327*  (2006.01)

(56) References Cited

U.S. PATENT DOCUMENTS

2008/0008416 A1* 1/2008 Prosyk .................. B82Y 20/00
                                                    385/20
2013/0121355 A1* 5/2013 Miyamoto ............ H01S 3/0632
                                                    372/36

OTHER PUBLICATIONS

Pokhmurska et al., "Laser Doping in Si, InP and GaAs," Applied Surface Science, 2000, 154-155: 712-715.
Winterfeldt et al., "High Beam Quality in Broad Area Lasers via Suppression of Lateral Carrier Accumulation," IEEE Photonics Technology Letters, Sep. 2015, 27: 1809-1812.

* cited by examiner

LATERALLY TAILORING CURRENT INJECTION FOR LASER DIODES

BACKGROUND

High power semiconductor laser diodes have uses in various fields including, among others, aerospace, defense, industrial welding and cutting, medical, and material processing. Relevant laser diode parameters include the brilliance, the optical output power per emitting area and emission angle. The emitting area and emission angle determine the beam quality, typically given as the Beam Parameter Product (BPP). Brilliance relates the output power of a laser diode to the amount of beam divergence for a particular size of the emitting area of the laser diode. Higher brilliance corresponds to greater laser output power for a particular divergence angle. Increasing the lateral width of the emitting area leads to higher power and potentially smaller divergence angle, however due to the increased emission area the brilliance does not necessarily increase in all cases. Furthermore, in case of an optical system with imaging ratio around one, an increase in the lateral size leads to a larger spot size which is not beneficial for fiber coupling or direct applications, such as cutting and welding.

SUMMARY

The present disclosure relates to tailoring current injection for laser diodes. Tailoring current injection according to the present disclosure may include fabricating the laser diode so that, during operation, a gradual variation in carrier injection, and thus current flow, occurs across the lateral directions (e.g., emitter width) and/or along the longitudinal directions (e.g., emitter length). The average width and shape of the gradual profile can vary along the longitudinal direction of the laser cavity. The variation can be designed such that maximum carrier injection occurs near a center of the emitter and gradually decreases away from the center, leading to more stable photon distribution, mitigation of filamentation, and reduction in beam divergence.

In general, in some aspects, the subject matter of the present disclosure encompasses a semiconductor laser diode including multiple layers stacked along a first direction, in which the multiple layers include: a first multiple of semiconductor layers; an optical waveguide on the first multiple of semiconductor layers, in which the optical waveguide includes a semiconductor active region for generating laser light, and in which the optical waveguide defines a resonant cavity having an optical axis; and a second multiple of semiconductor layers on the optical waveguide region, in which a resistivity profile of at least one layer of the multiple layers varies gradually between a maximum resistivity and a minimum resistivity along a second direction extending orthogonal to the first direction, in which a distance between the maximum resistivity and the minimum resistivity is greater than at least about 2 microns.

Implementations of the semiconductor laser diode can include one or more of the following features. For example, in some implementations, the minimum resistivity is centered along the second direction and gradually increases along the second direction toward the maximum resistivity near an edge of the semiconductor laser diode. The resistivity of the at least one layer may be symmetric about the first direction.

In some implementations, the second direction is orthogonal to the optical axis.

In some implementations, the second direction extends along the optical axis.

In some implementations, the first multiple of semiconductor layers includes a first semiconductor cap layer on the first contact layer, and a first semiconductor cladding region on the first semiconductor cap layer, and the second multiple of semiconductor layers includes a second semiconductor cladding region on the optical waveguide region, and a second semiconductor cap layer on the second semiconductor cladding region. The at least one semiconductor layer from the first multiple of semiconductor layers and/or from the second multiple of semiconductor layers exhibits the resistivity profile.

In some implementations, the at least one layer having the resistivity profile is in the first multiple of semiconductor layers, in which at least one layer in the second multiple of semiconductor layers exhibits an additional resistivity profile that varies gradually between a maximum resistivity and a minimum resistivity along the second direction, and in which a distance between the maximum resistivity of the additional resistivity profile and the minimum resistivity of the additional resistivity profile is greater than at least about 2 microns. The resistivity profile of the at least one layer in the first multiple of semiconductor layers extends no more than 10 microns from the first contact layer.

In some implementations, the distance between the maximum resistivity and the minimum resistivity gradually decreases from a first value at a first facet of the semiconductor laser diode to a second lower value at a second facet of the semiconductor laser diode, the second facet being at an opposite end of the semiconductor laser diode from the first facet.

In some implementations, the active region includes at least one quantum well.

In some implementations, the first multiple of semiconductor layers and the second multiple of semiconductor layers include III-V semiconductor compounds.

In some implementations, the first multiple of semiconductor layers and the second multiple of semiconductor layers include II-VI semiconductor compounds.

In some implementations, a difference between the maximum resistivity and the minimum resistivity is at least 1% of the minimum resistivity.

In general, in other aspects, the subject matter of the present disclosure may be embodied in methods of fabricating a semiconductor laser diode, in which the methods include: forming multiple laser diode layers stacked along a first direction, the multiple laser diode layers comprising a first multiple of semiconductor layers, an optical waveguide on the first multiple of semiconductor layers, and a second multiple of semiconductor layers on the optical waveguide, the optical waveguide defining a resonant cavity having an optical axis and comprising a semiconductor active region for generating laser light. Forming the multiple laser diode layers includes modifying a first semiconductor layer of the multiple laser diode layers to have a resistivity profile that varies gradually between a maximum resistivity and a minimum resistivity along a second direction extending orthogonal to the first direction, wherein a distance between the maximum resistivity and the minimum resistivity is greater than at least about 2 microns.

Implementations of the methods may have one or more of the following features. For example, in some implementations, modifying the first semiconductor layer includes implanting the first semiconductor layer with a varying concentration of dopant along the second direction to provide a doped first semiconductor layer that exhibits the resistivity profile. Implanting the first semiconductor layer with the varying concentration of dopant may include applying laser radiation to the first semiconductor layer. Applying laser radiation may include using a laser direct write process. Applying laser radiation may include performing a raster scan over a surface of the first semiconductor layer with the laser radiation. Performing the raster scan may include irradiating the surface of the first semiconductor layer along multiple parallel tracks. Implanting the first semiconductor layer with a dopant may alternatively include performing ion implantation on the first semiconductor layer. Modifying the first semiconductor layer may further include: forming a gradually varying gray-scale mask layer on a surface of the first semiconductor layer prior to performing ion implantation; and performing ion implantation through the gray-scale mask layer, in which a thickness or density of the gray-scale mask layer controls a local doping level within the first semiconductor layer. The gray-scale mask layer comprises a patterned photoresist layer. Forming the gray-scale mask layer may include: forming a photoresist layer on the first semiconductor layer; exposing the photoresist layer to radiation through a gray-scale lithography mask that locally defines a level of exposure of the photoresist; and applying a developer to the exposed photoresist layer to form the gray-scale mask layer. Forming the gray-scale mask layer may include: forming a photoresist layer on the first semiconductor layer; and applying laser radiation to the photoresist layer to define the gray-scale mask layer.

In some implementations, modifying the first semiconductor layer includes: implanting the first semiconductor layer with a dopant such that a conductivity within a predefined region of the first semiconductor layer changes from a first conductivity type to a second conductivity type, in which an electric field is established within the first semiconductor layer due to a difference in conductivity type between the predefined region and other regions of the first semiconductor layer. And a profile of the electric field along the lateral direction varies gradually along the second direction so that, during operation of the laser diode device, the first semiconductor layer exhibits the resistivity profile. Implanting the first semiconductor layer with a dopant may include performing ion implantation on the first semiconductor layer. Performing ion implantation may include: forming a gray-scale mask layer on a surface of the first semiconductor layer to block ions on prior to performing ion implantation; and performing the ion implantation through the gray-scale mask layer, in which a thickness or density of the gray-scale mask layer controls a local doping level within the first semiconductor layer.

In some implementations, modifying the first semiconductor layer includes: performing ion implantation on the first semiconductor layer to provide a passivated region that exhibit the resistivity profile. Performing ion implantation may include bombarding the first semiconductor layer with hydrogen or helium ions.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
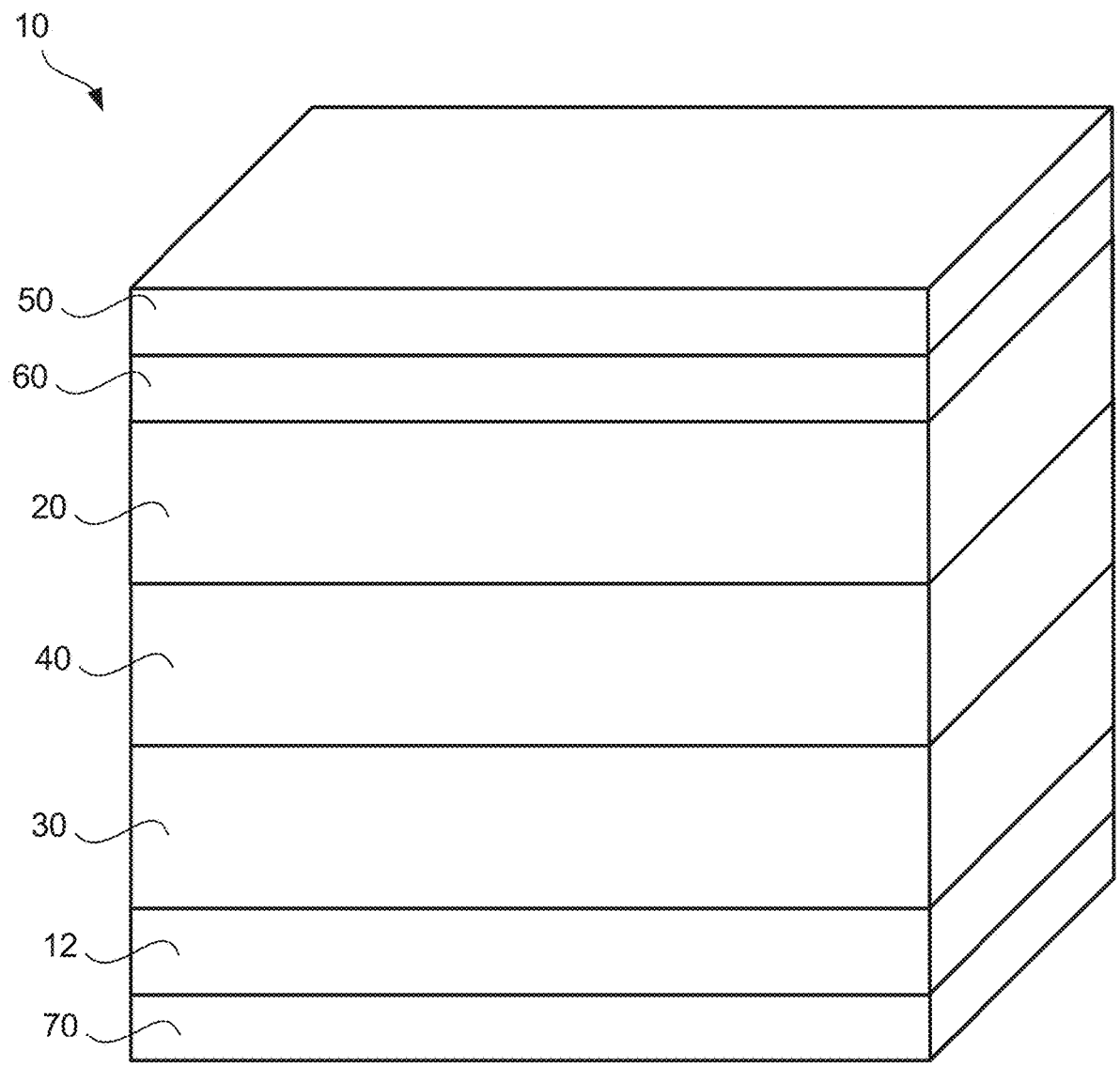
FIG. 1 is a schematic illustrating a perspective view of an example of a laser diode.

FIG. 1 is a schematic illustrating a perspective view of an example of a semiconductor laser device 10. In particular, the semiconductor laser device 10 is an example of an edge-emitting high power semiconductor laser diode. The laser device 10 includes a substrate 12 on which multiple semiconductor layers are formed. The layers depicted in FIG. 1 are exemplary for illustrating the general structure of a laser diode 10 and are not to scale. The multiple semiconductor layers may be divided into different sections of the laser device 10. For example, the multiple semiconductor layers may be divided into a cap region 60, first cladding region 20, a second cladding region 30 and an optical waveguide region 40. Both the cap region 60 and the first cladding region 20 include one or more layers of semiconductor material of a first type (e.g., p-type conductivity or n-type conductivity). The first cladding region 20 also may include one or more layers of intrinsic (e.g., undoped) semiconductor material. The second cladding region 30 includes one or more layers of a semiconductor material of a second type that is opposite that of the first doping type. That is, if the first doping type is p-type, then the second doping type is n-type and vice versa. The second cladding region 30 may include one or more layers of intrinsic semiconductor material.

The optical waveguide region 40 also includes one or more layers of semiconductor material. The optical waveguide region 40 includes a semiconductor gain region, also referred to as an active region, which is designed to emit laser light, e.g., as a result of population inversion. The optical waveguide region may include layers of either n- or p-doped semiconductor material. The semiconductor gain region may include, e.g., one or more quantum wells or may be a region that includes quantum dots. The optical waveguide region 40 includes additional semiconductor layers, such as barrier layers and confinement layers. The optical waveguide region 40 defines a resonant cavity having an optical axis extending along a longitudinal direction of the laser diode (e.g., the z-direction in FIG. 1). The materials included in the cladding regions 20, 30 have a refractive index lower than the refractive index of the optical waveguide region, such that together the cladding and waveguide regions together form a waveguide that confines light and defines a vertical cavity. The structure 10 also can include electrical contact layers. For instance, a metal layer 50 may form a contact layer on top of the cap region 60. Another metal layer 70 on the bottom surface of the substrate may form a second contact layer. Additionally, although only cap region 60 is shown, a second cap region may be formed between the bottom metal contact 70 and the second cladding region 30, e.g., between the bottom metal contact 70 and the substrate 12 or in place of the substrate 12.

The optically active region 40, cladding regions 20, 30, and cap layer 60 can be formed from semiconductor materials, such as Group II-VI or Group III-V semiconductor compounds including, for example, GaAs, AlGaAs, InGaAs, InGaAsP, InP, GaN, ZnSe, ZnTe, CdSe, InGaN, AlGaInP, and GaInAsSb, among others. Individual layers within the active region 40, the cladding regions 20, 30, and the cap layer 60 may have varying thicknesses. For instance, the thickness of individual layers may vary between a few nanometers (e.g., for a quantum well layer in the active region 40) to several thousand nanometers (e.g., for a cladding layer). Depending on the material and thicknesses of the layers chosen, the device 10 may emit light in various different wavelength bands including, e.g., visible wavelength bands, infrared wavelength bands, or ultraviolet wavelength bands.

The semiconductor layers of the optical waveguide region 40, cladding regions 20, 30 and cap layer 10 can be formed on the substrate 12 using standard semiconductor deposition processes, such as molecular beam epitaxy (MBE) and/or metal organic chemical vapor deposition (MOCVD). The structure 1 shown in FIG. 1, as well as the other laser structures disclosed herein, are intended to be representative examples of laser devices and do not limit the type of laser devices that can be formed using the processes disclosed herein. For instance, the laser devices can have different numbers of cladding layers, different numbers of barrier and confinement layers, each having a different composition and/or thickness. Similarly, the types of devices that can be formed using the processes disclosed herein are not limited to quantum well diode lasers or side-emitting diode lasers and can employ other laser structures, such as quantum well cascade lasers, quantum dot lasers, distributed Bragg reflector and distributed feedback lasers, among others.

Figure 2A:
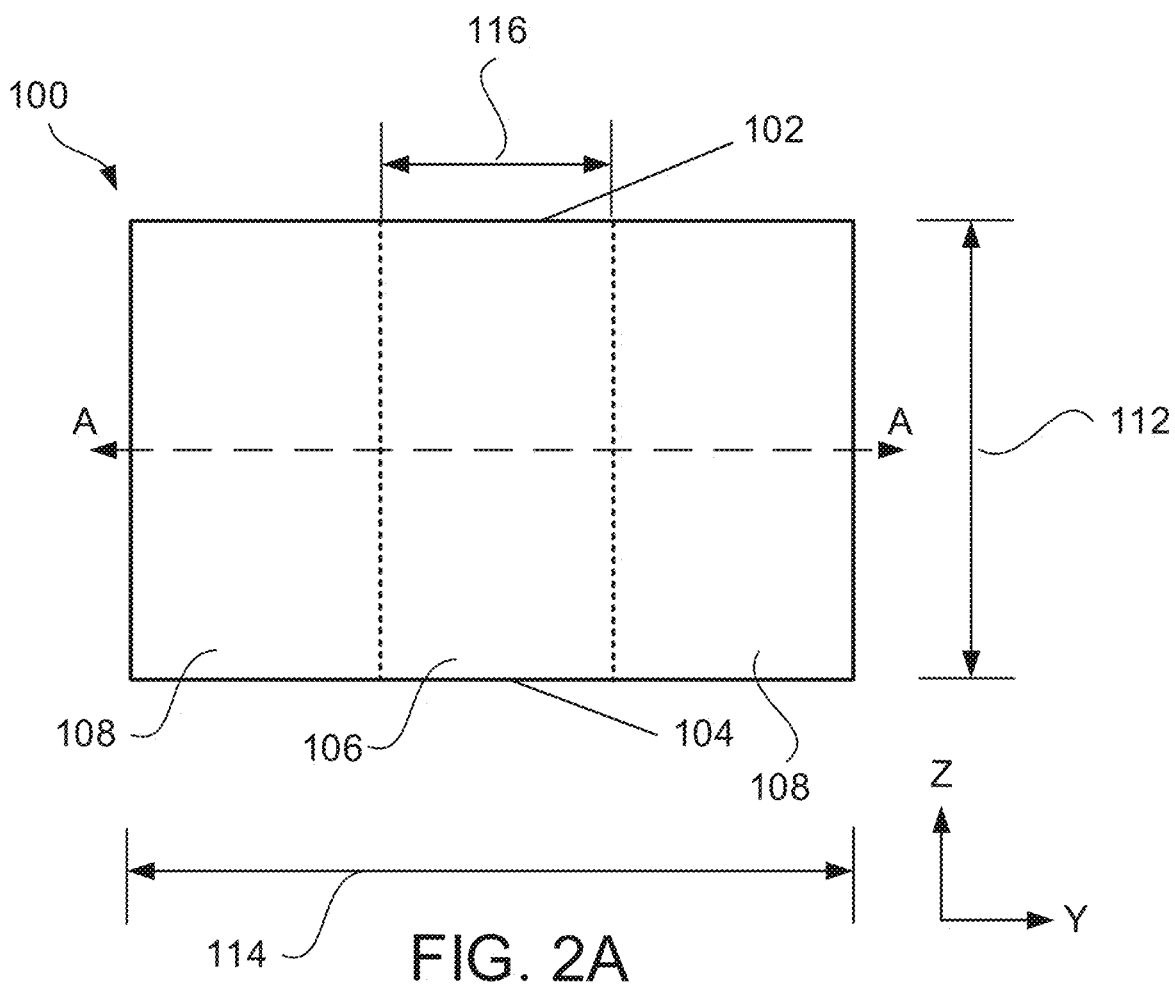
FIG. 2A is a top view of an example of a laser diode.
Figure 2B:
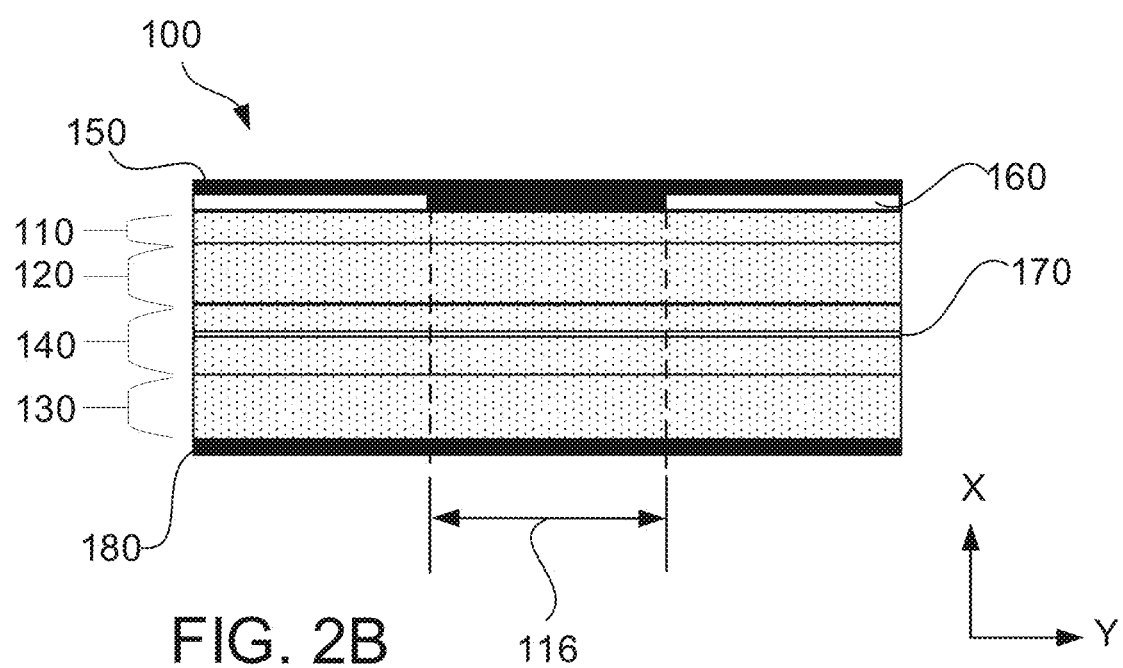
FIG. 2B is a schematic illustrating a lateral cross-sectional view of the laser diode in FIG. 2A through line A-A.

To improve brilliance of a laser diode, such as the laser diode 10 shown in FIG. 1, one may seek to reduce the beam divergence of the laser diode by laterally defining the current injection into the laser diode so that a gain guided laser is formed. FIGS. 2A-2B are schematics that illustrate an example of a laser diode device 100 configured to laterally define current injection. FIG. 2A is a top view of the laser diode 100, whereas FIG. 2B is a lateral cross-sectional view of the laser diode 100 in FIG. 2A through line A-A. As shown in FIG. 2A, the diode 100 includes a front facet 102 out of which laser light from the active region is emitted, and a highly reflective rear facet 104. A window region 106 having width 116 corresponds to an area where the top metal layer 150 is in direct physical contact with an underlying semiconductor layer of the cap layer and defines the lateral extent of current injection into the laser diode 100 (e.g., the emitter width). Regions 108 correspond to the borders on either side of the window region 106, where the top metal layer 150 is electrically insulated from the semiconductor cladding region. The longitudinal direction of diode 100 extends along axis Z, where diode 100 has a total length 112 (e.g., the emitter length). The lateral direction of diode 100 extends along axis Y, where diode 100 has a total width 114 that is greater than width 116. The structure illustrated in FIGS. 2A-2B may include other geometrical features such as etched trenches on each side of the contact opening 106 also utilized to form a ridge waveguide laser for additional index guidance.

Referring to FIG. 2B, a cross-section through line A-A of laser diode 100 is shown. As in the structure 1, the laser diode 100 includes multiple semiconductor layers stacked in a vertical direction on top of a substrate 180. For the purposes of this disclosure, a vertical direction corresponds to a direction that extends perpendicular to the diode waveguide junction (e.g., along the X-direction). Moreover, for the purposes of this disclosure, "lateral" or "laterally" refers to a direction that is parallel to the diode waveguide junction and may generally be used in reference to the width of the laser diode (e.g., along the Y-direction). Similarly, "longitudinal" or "longitudinally" may generally refer to a direction that is parallel to the diode waveguide junction and that is orthogonal to the lateral direction, and may generally be used in reference to the length of the laser diode (e.g., along the Z-direction). For ease of illustration, general regions are shown instead of each individual semiconductor layer. In particular, the laser diode 100 includes a cap layer 110, a first cladding region 120 of a first conductivity type and a second cladding region 130 of a second conductivity type. Each of the first and second cladding regions may include one or more intrinsic semiconductor layers. The laser diode 100 also includes an optical waveguide region 140 that defines a resonant cavity having an optical axis extending along a longitudinal direction (Z-axis into the page), in which the optical waveguide region includes a semiconductor gain region 170 (also referred to as an active region), where laser light is generated through population inversion. Current injection into the laser diode 100 is laterally limited by the structured window region 106, also referred to as the contact opening 106. A patterned insulating layer 160 is formed on a top surface of the cladding region 120 and includes an opening through which the metal layer 150 is allowed to directly contact the semiconductor cap layer 110. The cap layer 110 may be formed to have high electrical conductivity (low resistivity) relative to the other layers within the diode 100. The structure shown in FIGS. 2A-2B provides a low resistivity region in the window area 106 through the direct metal-semiconductor contact, and high resistivity in the areas 108 due to the presence of the insulating layer 160. As a result, current injection during operation of the laser diode 100 primarily occurs in the lateral region defined by the window 106 and limits the divergence of an outgoing laser beam.

Figure 2C:
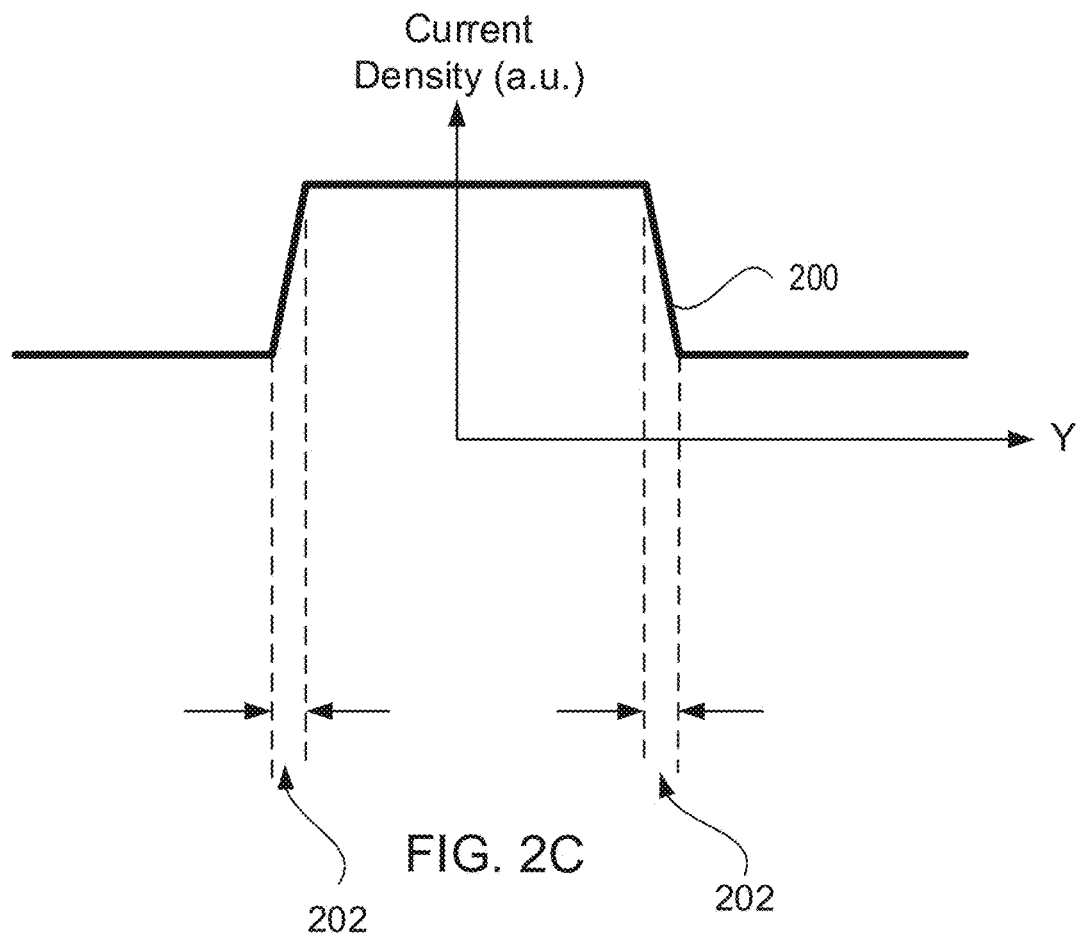
FIG. 2C is a plot illustrating an example current density of the laser diode of FIG. 2B.

FIG. 2C is a plot that illustrates an example of vertically averaged (along the X-direction) current density 200 through the cap layer 110 identified in FIG. 2B during operation of the device 100. The current density 200 is represented in arbitrary units (a.u.) and exhibits a "top-hat" or step-like profile in which the current density is a minimum in the areas outside of the region 106, but reaches a flat peak within the region 106. Ignoring edge effects at the contact opening, the maximum current density value is essentially constant throughout region 106 due to the low resistivity between the top contact 150 and the cap layer 110. The minimum current density value in the areas outside of region 106 is due to the high resistivity resulting from the presence of the insulating layer 160 between the cap layer 110 and the metal layer 150. Transition regions 202 may correspond to regions where the resistivity (e.g., the vertically averaged resistivity) increases from the minimum value to the maximum value. The transition region may be limited a lateral width of less than, e.g., 1-10 nm. Although the current density profile shown in FIG. 2C is for the cap layer 110 alone, the device 100 may exhibit similar current density profiles within the cladding regions and parts of the waveguide region.

Figure 2D:
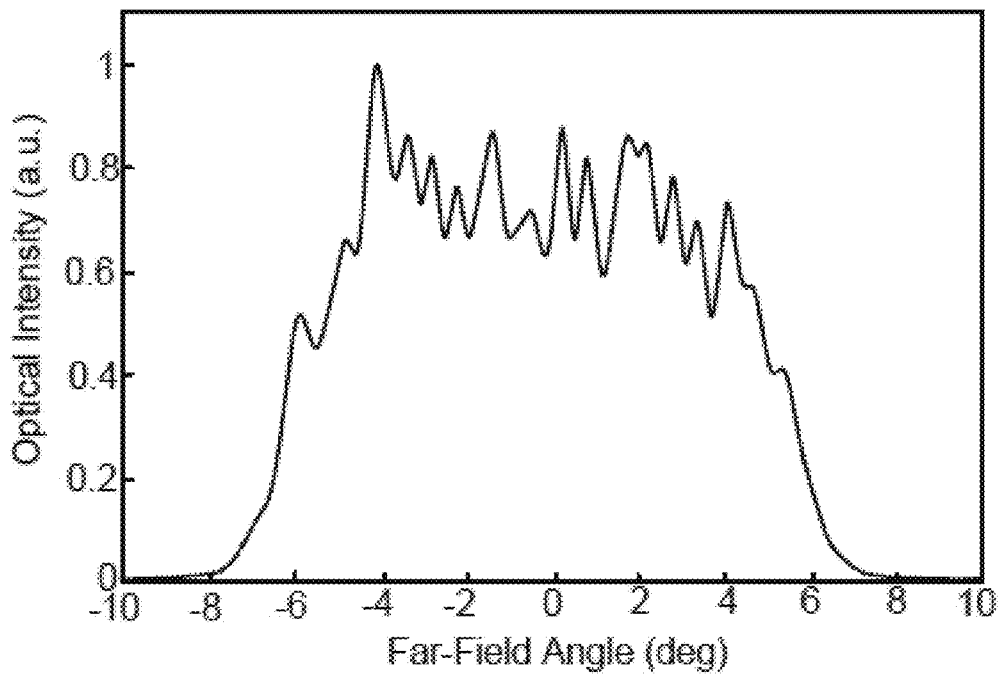
FIG. 2D is a plot illustrating an example optical intensity.

A drawback of the current density profile shown in FIG. 2C is that it may lead to local peaks in current density (e.g., filamentation) and at the edges of the contact opening 106. Such current density peaks can cause hot spots where the device locally increases in temperatures, as well as higher than desired beam divergence and depolarization, each of which can ultimately limit the brilliance and reliability achievable by the laser diode. As an example, FIG. 2D is a plot illustrating an example optical intensity in arbitrary units versus far-field angle θ (degrees) for the structure shown in FIG. 2B. As evident from FIG. 2D, the optical intensity has a relatively wide divergence extending over a range of about 12 degrees and exhibits relatively unstable near- and far-field photon distribution over that same range.

To reduce carrier accumulation, and the accompanying drawbacks, such as beam divergence, depolarization and filamentation, a laser diode, such as laser diode 10, can be modified so that it exhibits a gradually varying current injection across the emitting region (e.g., across the emitting region width and/or length) rather than the step-like or top-hat profile exhibited in FIG. 2C. Moreover, in some implementations, a gradual variation in the current injection, rather than the abrupt step-like profile, may suppress higher order transverse modes. A current density profile of a such laser diodes under operation will gradually increase from a minimum value located near one end of the emitter toward a maximum value, which may be centered along the emitter width and/or length, and then gradually decreases again toward another minimum located near an opposite end of the emitter.

Figure 3A:
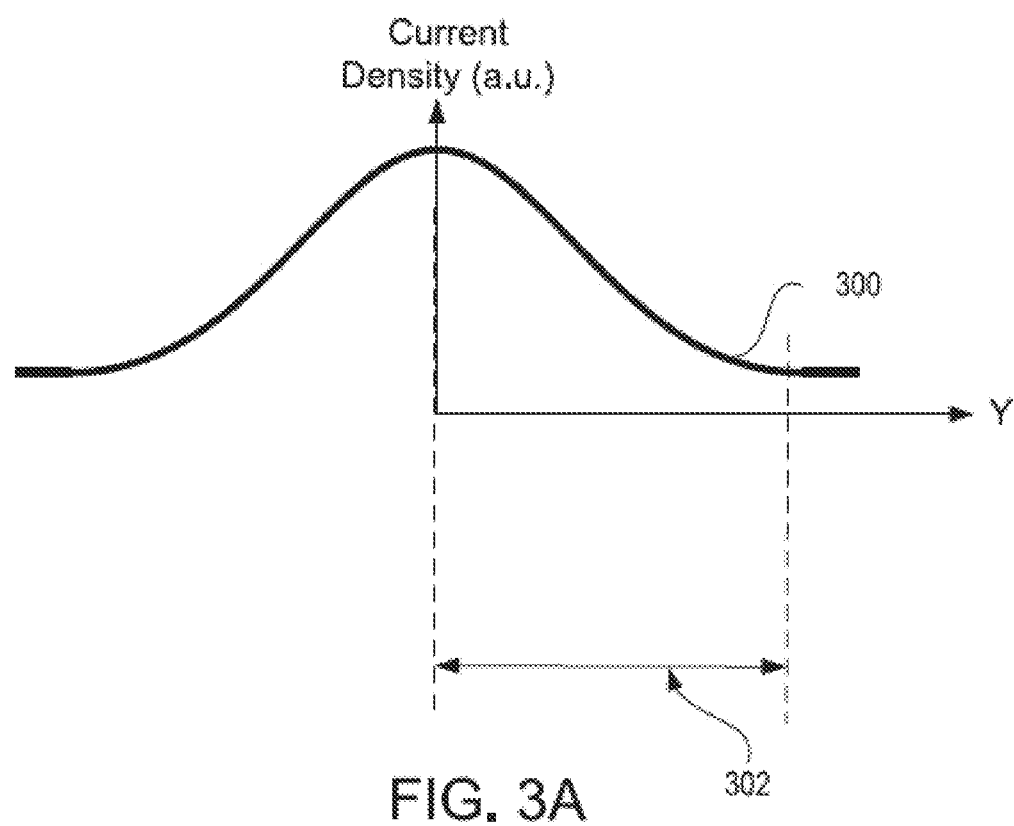
FIG. 3A is a plot illustrating an example of a laterally tailored current density across the width of a laser diode.

For instance, FIG. 3A is a schematic that illustrates an example of a vertically averaged current density profile across a laser diode emitter width. The current density profile is an average along a direction that is perpendicular to the plane of the laser diode junction within the active region. The current density profile shown in FIG. 3A gradually decreases away on either side of a rounded peak. In contrast to the current density profile shown in FIG. 2C, the width of the transition regions 302 between the maximum and minimum values are much wider, which allows the higher order transverse modes to be suppressed, and effects such as beam divergence, depolarization and filamentation to be reduced. For instance, each transition region 302 may have a width of 2 microns or more, including, e.g., a width of 3 microns or more, a width of 5 microns or more, a width of 10 microns or more, a width of 15 microns or more, a width of 20 microns or more, a width of 25 microns or more, a width of 30 microns or more, a width of 35 microns or more, a width of 40 microns or more, a width of 45 microns or more, or a width of 50 microns or more, among others. The maximum width of the transition regions 302 may be set by half the width of the emitting region (equivalent to the contact opening width for a standard device). For instance, if the width of the emitting region is 100-200 microns, the width of the transition region may be no more than 50-100 microns.

Figure 3B:
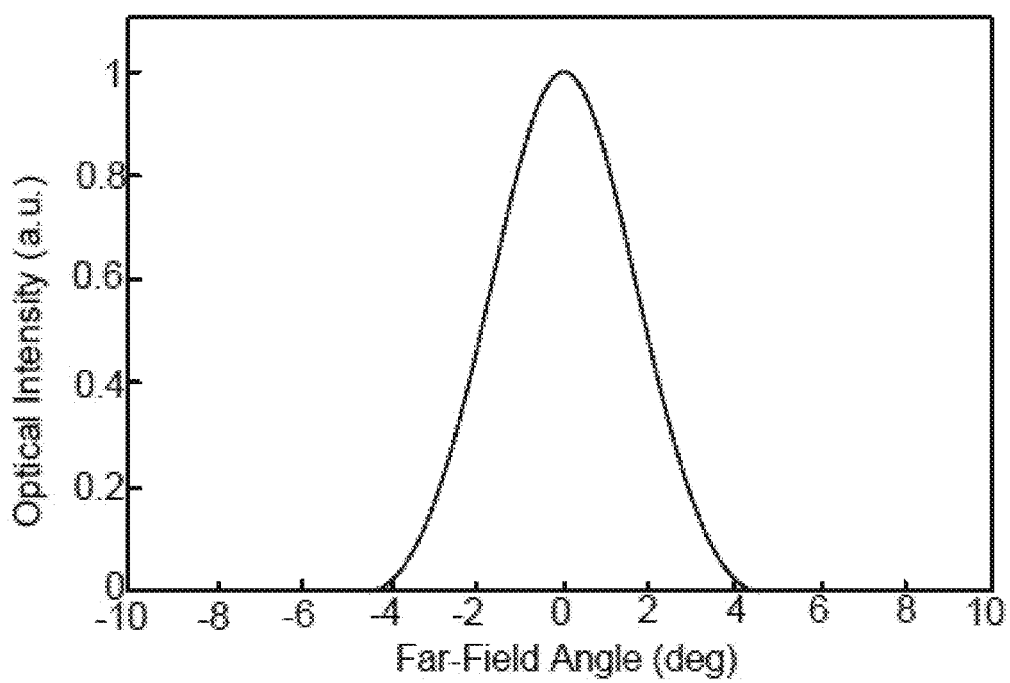
FIG. 3B is a plot illustrating an example optical intensity.

FIG. 3B is a plot that exhibits an example simulated optical intensity in arbitrary units versus far-field angle θ (degrees) for a laser diode operating with the lateral current density profile shown in FIG. 3A. As seen from FIG. 3B, the resulting optical intensity profile has far less divergence than the optical intensity profile shown in FIG. 2D, with a far-field divergence (full) angle extending over 4 degrees instead of 12 degrees. Furthermore, the photon distribution in the beam is far more stable, with a reduced number of peaks (filaments) or as illustrated for the optimal case with only a single peak centered at 0 degrees.

A gradual variation in the lateral current density, such as the averaged current density profile shown in FIG. 3A, can be implemented in a laser diode using different laser diode structures. For example, in some implementations, a gradual variation in current density across the emitter width and/or length can be obtained by introducing a gradual variation in the resistivity within a region on the p-side and/or on the n-side of the laser diode. The region into which the gradual resistivity variation is introduce may include one or more layers of the cap, cladding and/or waveguide region of the laser diode. The resistivity may be vertically averaged along the direction in which the semiconductor layers are stacked. The gradual variation in the resistivity may occur along a plane that is orthogonal to the direction along which the semiconductor layers are stacked (e.g., a lateral direction orthogonal to the optical axis and/or a longitudinal direction parallel with the optical axis). For instance, the resistivity within the cap layer may gradually decrease from a maximum resistivity value near the edges of the emitting region toward a minimum resistivity value near the center of the emitting region, with the transition region 302 corresponding to the distance between the maximum and minimum average resistances.

The magnitude of the difference between the maximum and minimum resistance values within the transition region 302 may vary depending on the device design. For example, the difference between the maximum resistivity and the minimum resistivity may be at least 1% of the minimum resistivity, at least 2% of the minimum resistivity, at least 5% of the minimum resistivity, at least 10% of the minimum resistivity, at least 25% of the minimum resistivity, at least 50% of the minimum resistivity, or at least 75% of the minimum resistivity, among others. As further examples, the maximum resistivity may be two times, four times, five times, ten times, twenty-five times, fifty times, or one-hundred times, or more, as high as the minimum resistivity. The difference between the minimum and maximum resistivity may be limited at a high end based on the technique used to vary the resistivity within the semiconductor layer. For example, the resistivity of the semiconductor layer may be modified by introducing dopants into the semiconductor layer. Thus, the maximum resistivity of the layer may be limited by the natural undoped resistivity of the semiconductor material.

The current density profile illustrated in FIG. 3A is not the only gradually varying profile shape that may be used. For instance, in some implementations, the current density profile (e.g., the vertically averaged current density profile) may be monotonically increasing within the transition region 302 from the minimum current density value to the maximum current density value. In some implementations, the variation between the minimum current density value and the maximum current density value within the transition region 302 is linear. In some implementations, the variation between the minimum current density value and the maximum current density value within the transition region 302 follows an exponential curve. In some implementations, the current density profile between the minimum and maximum current density has an S-like shape in which the current density plateaus levels out at an intermediate value between the minimum and maximum current densities. Other profile shapes also are possible.

Figure 4A:
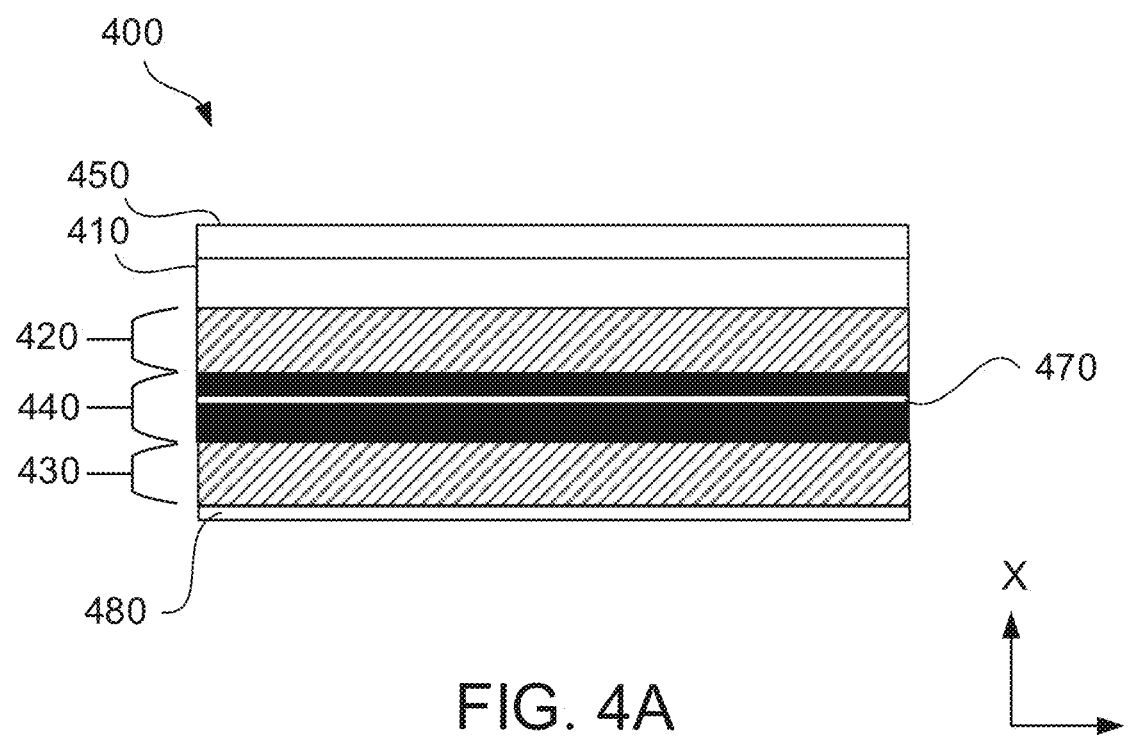
FIG. 4A is a schematic illustrating a cross-sectional view of a laser diode having a laterally tailored doping profile.

FIG. 4A is a schematic that illustrates a cross section of a laser diode 400 that incorporates a gradual variation in resistivity laterally across the width of the diode. Laser diode 400 includes multiple semiconductor layers stacked in a vertical direction (along the X-axis) on a semiconductor substrate 480. For ease of illustration, general regions are shown instead of each individual semiconductor layer. The regions include: a first cladding region 420 of a first conductivity type (e.g., doped p-type) and a second cladding region 430 of a second conductivity type (e.g., doped n-type). Each of the first and second cladding regions may include one or more intrinsic (e.g., undoped) semiconductor layers. The laser diode 400 also includes an optical waveguide region 440 between the first cladding region 420 and the second cladding region 430, in which the optical waveguide region defines a resonant cavity having an optical axis extending along a longitudinal direction (Z-axis into the page). The optical waveguide region 440 includes a semiconductor gain region 470 (also referred to as an active region), where laser light is generated, e.g., at a junction between p-type and n-type semiconductor material. A metal layer forming a contact layer may be arranged on the bottom surface of the substrate 480.

The laser diode 400 also includes a cap layer 410. The cap layer 410 is a semiconductor layer of the first conductivity type (e.g., doped p-type) and may be designated as part of the first cladding region 420 or separate from the first cladding region 420. The cap layer 410 is covered by a metal layer 450, which corresponds to the top laser diode contact. The metal layer is formed in direct physical contact with an upper surface of the cap layer 410. The concentration of the p-type dopant within the semiconductor cap layer 410 and potentially within the cladding layer is gradually laterally varied so that the resistivity within the cap layer 420 also gradually varies along a width of the laser diode 400 (the lateral direction along the Y-axis in FIG. 4A). In an example, the cap layer 410 may be doped so that a resulting resistivity along the width of the cap layer 420 gradually decreases from a maximum at either end of the laser diode 400 to a minimum centered along the lateral direction.

Figure 4B:
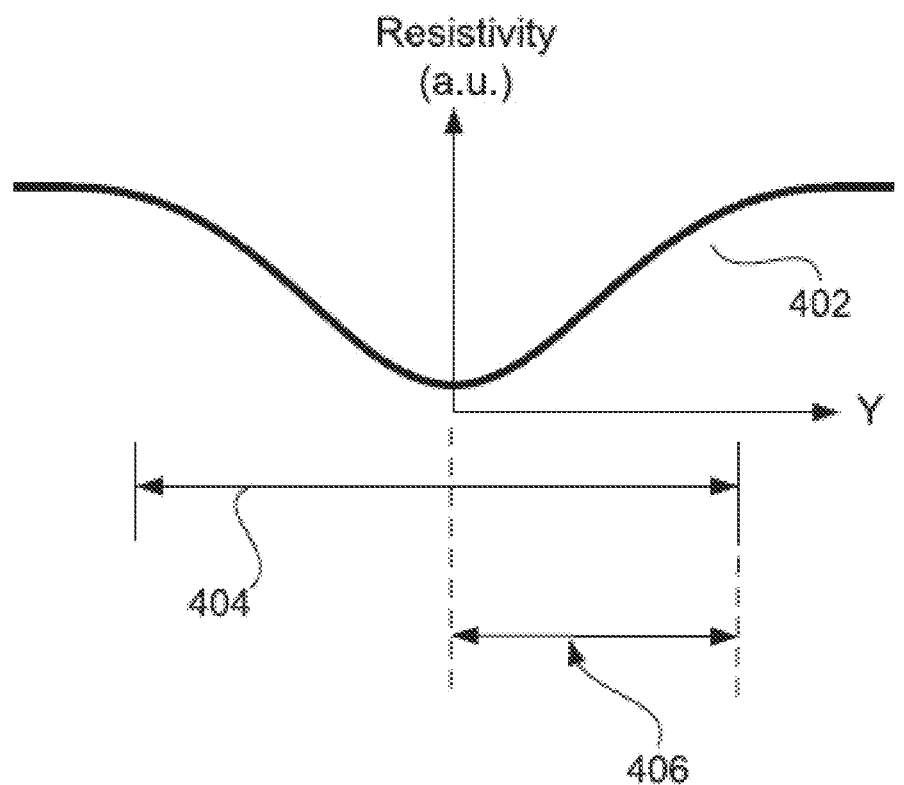
FIG. 4B is a plot illustrating an example resistivity of the laser diode of FIG. 4A.

An example resistivity profile 402 within the cap layer 410 is shown in FIG. 4B. The resistivity profile 402 represents a vertically averaged resistivity within the cap layer 410 laterally across the illustrated cross-section of device 400. During operation of the laser diode 400, when a forward bias potential is applied across the top diode contact (layer 450) and the bottom contact (not shown), the amount of current injected into the diode is dependent on the corresponding resistivity encountered in the cap layer 410. That is, the current density profile will be proportional to the conductivity of the cap layer 410 through which the current travels. Thus, for cap layer 410, the lateral current density profile will be approximately inversely proportional to the lateral resistivity profile 402 shown in FIG. 4B. This is because in regions of the cap layer 410 where resistivity is higher (e.g., towards the left and right ends of the device along the Y-axis), very little current flows, whereas toward the center of the device, the resistivity is much lower and current density is larger.

The "effective" width of the laser diode emitting region can be defined by doping the cap layer 410 such that the resistivity outside of a predefined width 404 is so high that little or no appreciable current flows through those areas during operation of the device. For the portion of cap layer 410 within width 404, however, the cap layer 410 can be doped such that current flows near the center of the device 400 along the lateral Y-axis. Some implementations, the effective width 404 may be determined as the distance between maximum resistivity values of the resistivity profile 402. The effective width may be, e.g., greater than about 4 microns, greater than about 10 microns, greater than about 20 microns, greater than about 50 microns, greater than about 100 microns, greater than about 150 microns, greater than about 200 microns. Other effective widths also are possible. The effective width of the resistivity profile shown in FIG. 4B corresponds to a particular plane that is orthogonal to the longitudinal direction of the laser diode device 400. This effective width may be uniform along the longitudinal direction (e.g., it does not change from the front facet to the back facet of the device along the Z-direction) or it may vary in size as one moves from the front facet to the back facet of the device. An advantage of laterally tailoring the doping within the cap layer 410, or within other semiconductor layers of the laser diode device, is that it is not necessary to form a separate structured insulating layer on the surface of the cladding region to define the laser diode emitter window, such as the insulating layers 160 shown in FIGS. 2A-2B. Instead, the semiconductor cap layer 410 itself may be used to define the high conductivity central emitter window and the low conductivity insulating regions that adjoin the emitter window.

The resistivity profile 402 may be associated with a transition region 406 that corresponds to the distance between the maximum resistivity and the minimum resistivity. For instance, each transition region 406 may have a width of 2 microns or more, including, e.g., a width of 3 microns or more, a width of 5 microns or more, a width of 10 microns or more, a width of 15 microns or more, a width of 20 microns or more, a width of 25 microns or more, a width of 30 microns or more, a width of 35 microns or more, a width of 40 microns or more, a width of 45 microns or more, or a width of 50 microns or more, among others. The maximum width of the transition regions 406 may be set by half the width of the emitting region (where the width of the emitting region is equivalent, e.g., to the contact opening width for a conventional device formed using an insulating layer having a contact opening on the cap layer). For instance, if the width of the emitting region is 100-200 microns, the width of the transition region may be no more than 50-100 microns. The magnitude of the difference between the maximum and minimum resistance values within the transition region 406 may vary depending on the device design, as described above with respect to transition region 302.

As explained herein, in some implementations, the gradually varying doping profile may be introduced into layers other than just the cap layer 410. For example, in some implementations, one or more of the semiconductor layers within the first cladding region 420, or even the waveguide layers 440, also are doped to have a gradually varying doping profile, such as the profile 402 shown in FIG. 4B, across the width of the laser diode device. Thus, in some cases, a vertically averaged resistance profile having the shape shown in FIG. 4B may correspond, e.g., to an average resistivity across all of the cap layer 410, the cladding region 420 and the waveguide region 440 in the illustrated cross-section of device 400.

In some implementations, a gradually varying doping profile is introduced in the second cladding region 430 or in the substrate 480. For example, one or more semiconductor layers of the second cladding region 430 may be doped to have a lateral resistivity profile similar to the profile 402, where the resistivity is lowest at a center location along the width of the laser diode 400 (along the Y-direction) and gradually increases to a maximum toward the edges of the device 400.

As explained herein, the tailored gradual variation in resistivity may be achieved by gradually varying the doping concentration across the width and/or length of the device (e.g., across the Y and/or Z direction). Alternatively, in some implementations, the laterally tailored gradual variation in resistivity may be achieved by passivation of a previously doped semiconductor layer. For instance, for a cap layer that is doped a first conductivity type, ion implantation (e.g., with hydrogen or helium ions) may be used to passivate the doped regions of the cap layer by creating localized disordered regions along the width of the laser diode, resulting in a doping profile, and thus resistivity, that varies across the emitter width.

In some implementations, a gradual variation in the lateral current density can be implemented by introducing a lateral gradually variation in electric field gradient across the width of the laser diode. For instance, the lateral gradual variation in electric field may be introduced by forming a tailored p-n junction across the width of the laser diode.

Figure 5A:
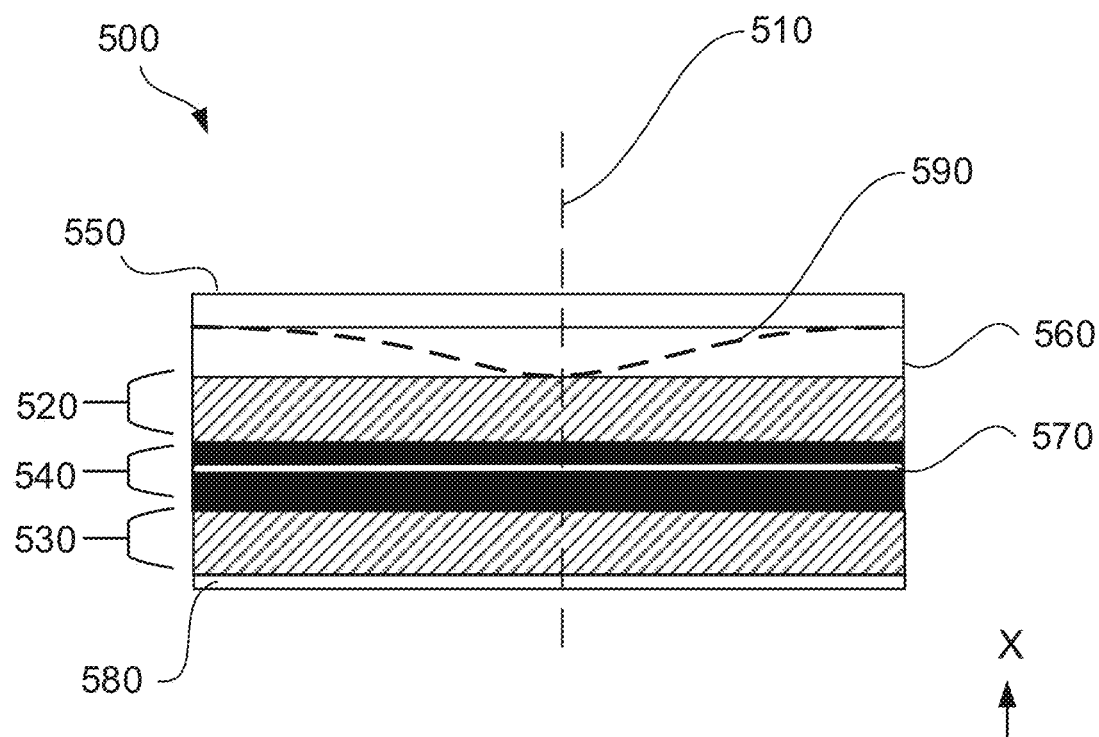
FIG. 5A is a schematic illustrating a cross-sectional view of a laser diode having a laterally tailored p-n junction profile.

FIG. 5A is a schematic illustrating a cross-sectional view of a laser diode 500 having a laterally tailored p-n junction profile. Laser diode 500 includes multiple semiconductor layers stacked in a vertical direction (along the X-axis) on a semiconductor substrate 580. For ease of illustration, general regions are shown instead of each individual semiconductor layer. The regions include: a first cladding region 520 and a second cladding region 530 of a second conductivity type (e.g., n-type). The laser diode 500 also includes an optical waveguide region 540 between the first cladding region 520 and the second cladding region 530, in which the optical waveguide region defines a resonant cavity having an optical axis extending along a longitudinal direction (Z-axis into the page). The optical waveguide region 540 includes a semiconductor gain region 570 (also referred to as an active region), where laser light is generated through population inversion. A metal layer forming a contact layer may be arranged on the bottom surface of the substrate 580. A top metal layer 550 forms a top contact.

The laser diode 500 also includes an upper cladding layer 560 that is nearest to the top metal layer 550. In contrast to the other semiconductor layers, which are either doped of the first conductivity type (e.g., p-type), a second conductivity type (e.g., n-type) or semi-insulating (e.g., an intrinsic or i-type semiconductor without significant doping), layer 560 is doped such that it exhibits a p-n junction 590 (dashed line) extending across the width (along the Y-axis) of the laser diode 500. For instance, the area of layer 560 above the junction 590 (in the positive X-direction) is doped to provide the first conductivity type, whereas the area of layer 560 beneath the junction 590 (in the negative X-direction) is doped to provide the second conductivity type. The presence of the p-n junction gives rise to built-in potential that opposes the forward bias potential applied across the top and bottom metal contacts during operation of the laser diode 500. The magnitude of the built-in potential depends on the concentration of the n-type dopants on the n-side of layer 560 and the concentration of the p-type dopants on the p-side of layer 560. The doping profile may be modified such that the vertical location (along the X-axis) and the built-in potential of the junction 590 gradually varies over the width (e.g., along the Y-axis) of the laser diode 500. In some implementations, the layer 560 is doped such that near the edges of the device the junction 590 is eliminated altogether. For instance, the layer 560 may be doped such that toward the left and right edges of laser diode 500, the layer 560 is entirely n-type. The layer 560 may also be doped such that near a center axis 510, the layer 560 is entirely p-type while gradually introducing the p-n junction within layer 560 away from the center axis 510.

Figure 5B:
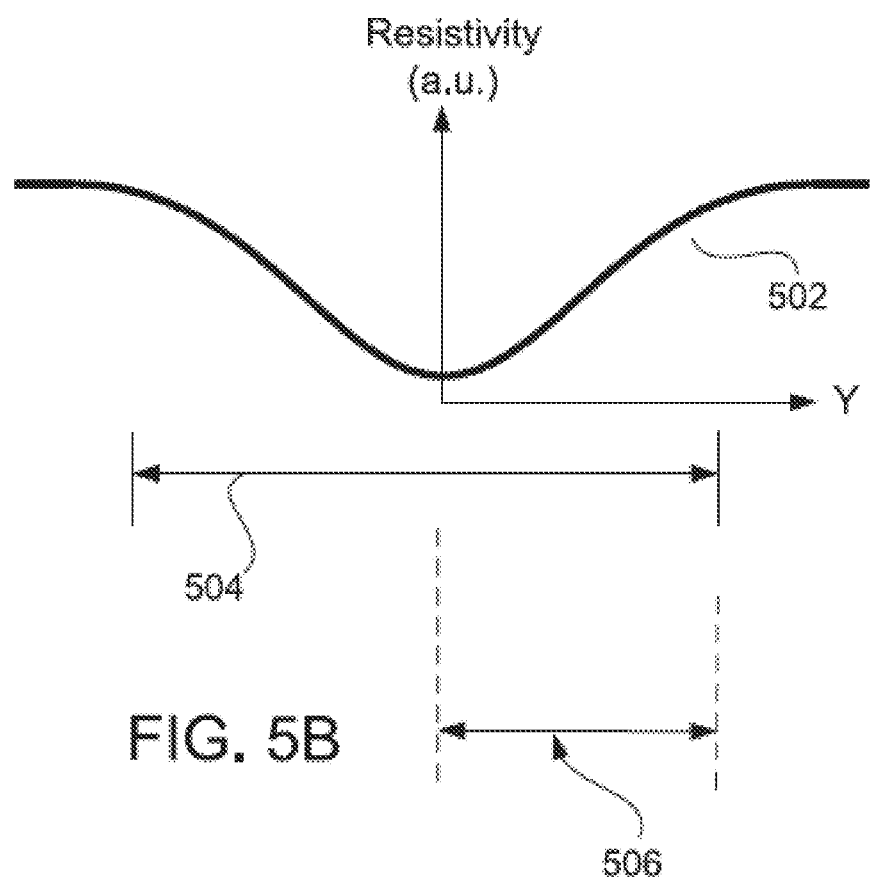
FIG. 5B is a plot illustrating an example resistivity of the laser diode of FIG. 5A.

The built-in potential created by introducing the opposite-type dopant in layer 560 gives rise to a corresponding variation in resistivity within layer 560. That is, the built-in potential results in a spatially varying blocking contact region. An example of a resistivity profile 502 created by introducing an opposite type dopant within the layer 560 is shown in FIG. 5B. The resistivity profile 502, which can include, e.g., resistivity averaged along the X-direction within layer 560, gradually decreases from a maximum at the left and right sides of the layer 560 to a minimum centered along the lateral direction (e.g., at the center axis 510). In some implementations, the minimum value may correspond to a portion of the semiconductor layer 560 in which no reverse bias built-in potential is formed.

During operation of the laser diode 500, when a forward bias potential is applied across the top diode contact (layer 550) and the bottom contact (not shown), the amount of current injected into the diode is dependent on the magnitude of the built-in reverse bias potential in layer 560. That is, the current density profile will be inversely proportional to the resulting overall resistivity profile 502. This is because in regions of the layer 560 where the built-in reverse bias potential is higher (e.g., towards the left and right ends of the device along the Y-axis) relative to the applied electric field, very little current flows, whereas toward the center of the device, the built-in reverse bias potential is much lower and/or non-existent and current can flow more freely through layer 560.

The "effective" width of the laser diode emitting region can be defined by doping the layer 560 such that the built-in potential outside of a predefined width 504 is so high that no appreciable current flows those areas during operation of the device. For the portion of layer 560 within width 504, however, the layer 560 can be doped such that the built-in potential is lower and current more easily flows near the center 510 of the device 500. In some implementations, the effective width may be determined based on the distance between the maximum resistivity values of the resistivity profile 502. The effective width may be, e.g., greater than about 4 microns, greater than about 10 microns, greater than about 20 microns, greater than about 50 microns, greater than about 100 microns, greater than about 150 microns, greater than about 200 microns. Other effective widths also are possible. The effective width of the resistivity profile shown in FIG. 5B corresponds to a particular plane that is orthogonal to the longitudinal direction of the laser diode device 500. This effective width may be uniform along the longitudinal direction (e.g., it does not change from the front facet to the back facet of the device along the Z-direction) or it may vary in size as one moves from the front facet to the back facet of the device. In either case, no separate structured insulating layer on the surface of the cladding region is necessary to define the laser diode emitter window, in contrast to the structures shown in FIGS. 2A-2B.

The resistivity profile 502 may be associated with one or more transition regions 506 that correspond to the distance between the maximum resistivity and the minimum resistivity. For instance, each transition region 506 may have a width of 2 microns or more, including, e.g., a width of 3 microns or more, a width of 5 microns or more, a width of 10 microns or more, a width of 15 microns or more, a width of 20 microns or more, a width of 25 microns or more, a width of 30 microns or more, a width of 35 microns or more, a width of 40 microns or more, a width of 45 microns or more, or a width of 50 microns or more, among others. The maximum width of the transition regions 506 may be set by half the width of the emitting region (where the width of the emitting region is equivalent, e.g., to the contact opening width for a conventional device formed using an insulating layer having a contact opening on the cap layer). For instance, if the width of the emitting region is 100-200 microns, the width of the transition region may be no more than 50-100 microns. The magnitude of the difference between the maximum and minimum resistance values within the transition region 506 may vary depending on the device design, as described above with respect to transition region 302.

In some implementations, the gradually varying p-n junction may be introduced into layers other than just the layer 560. For example, in some implementations, one or more of the semiconductor layers within the first cladding region 520 are doped to have a laterally varying p-n junction profile giving rise to gradient built-in reverse bias potential.

In some implementations, a gradually varying doping p-n junction profile is introduced in the second cladding region 530. For example, one or more semiconductor layers of the second cladding region 530 may be doped to introduce a built-in reverse bias potential having a resistivity profile similar to the profile 502, where the resistivity is lowest at a center location (e.g., center axis 510) along the width of the laser diode 500 and gradually laterally increases to a maximum resistivity outward from the center location toward the edges of the device 500. Though the built-in reverse bias potentials and corresponding resistivity profiles are described herein as extending laterally along the Y-axis, such profiles may be alternatively or additionally introduced longitudinally within the device (e.g., along the Z-axis).

Figure 6:
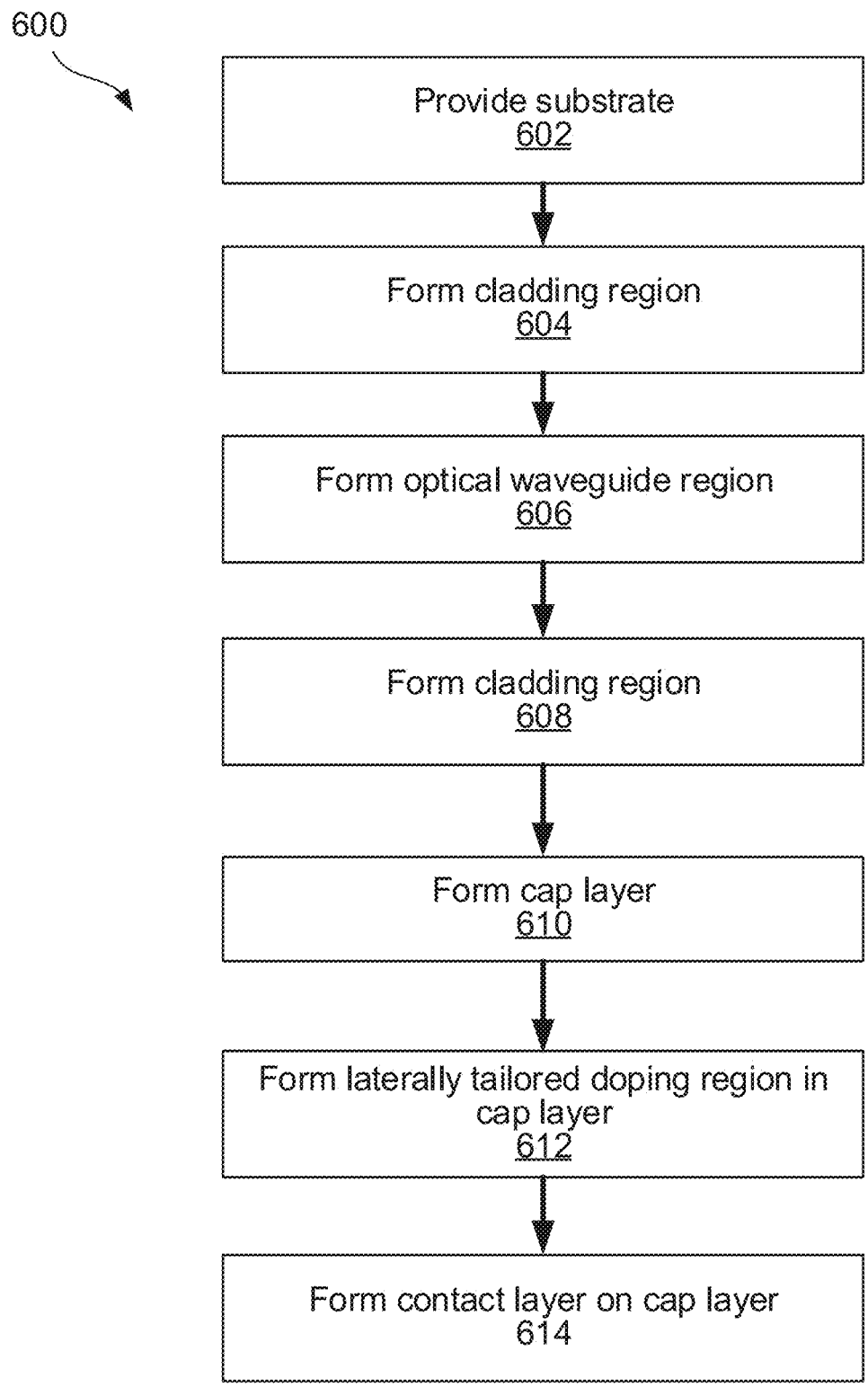
FIG. 6 is a flow chart depicting a fabrication process for a laser diode having a laterally tailored doping profile.

FIG. 6 is a flow chart depicting an exemplary fabrication process 600 for a laser diode having a laterally tailored doping profile, such as that disclosed with respect to FIGS. 4A-4B. The layers formed in the process may be fabricated using standard semiconductor deposition processes, such as molecular beam epitaxy (MBE) or metal organic chemical vapor deposition (MOCVD). Process 600 includes first providing (602) a semiconductor substrate of a second conductivity type, such as, e.g., a GaAs wafer doped n-type (e.g., using Si as the dopant material). A cladding region of the second conductivity type then is fabricated (604) on an upper surface of the substrate. The cladding region may include one or more layers of n-type doped semiconductor layers such as, e.g., AlGaAs. The cladding region may also include one or more intrinsic (e.g., undoped) semiconductor layers formed of the same or different material as the doped cladding layers. In some implementations, the concentration of the dopant is highest in the lowermost cladding layers nearest to the substrate and the concentration of the dopant is lowest in the uppermost cladding layers.

An optical waveguide region then is formed (606) on an uppermost surface of the previously fabricated cladding region. The optical waveguide region may include intrinsic confinement and/or barrier layers, as well as an active layer, such as an InGaAs quantum well. A cladding region of the first conductivity type then is fabricated (608) on the uppermost surface of the optical waveguide region. This cladding region may include one or more p-type doped semiconductor layers, such as, e.g., AlGaAs (using e.g. C as the dopant). The cladding region of the first conductivity type may also include one or more intrinsic semiconductor layers formed of the same or different material as the doped cladding layers. In some implementations, the concentration of the dopant is the lowest in the lowermost cladding layers nearest to the optical waveguide region and the concentration of the dopant is highest in the uppermost cladding layers furthest from the optical waveguide region.

A cap semiconductor layer then is formed (610) on an uppermost surface of the cladding region of the first conductivity type. Alternatively, in some implementations, the cap layer is formed as part of the cladding region of the first conductivity type in step (608). In either case, the cap layer is formed as an intrinsic (unintentionally doped) layer. A laterally tailored doping region then is formed (612) in the cap layer. To obtain the gradual lateral variation in doping profile as disclosed herein, various techniques may be used.

For example, in some implementations, the gradual lateral variation in doping profile may be obtained by performing laser doping on the exposed upper surface of the cap layer. Laser doping is an established process by which solid-phase doping may be performed to obtain ohmic contacts and/or p-n junctions without the need to perform lithography and development of a resist or other mask. Laser doping may be performed using a direct write process during which a laser irradiates a surface of the semiconductor in the presence of a gas containing the dopant material. As the laser irradiation heats the semiconductor, the dopant molecules from the gas accumulate and may adsorb on or otherwise adhere with the surface of the semiconductor. The dopant molecules then diffuse into the semiconductor material from the surface. The direct write process may include applying the laser irradiation in a pulsed manner (e.g., where a pulse period may be in the range of 1 fs to 1 µs) and translating the position at which the laser is incident on the semiconductor over the semiconductor surface. Further information regarding laser doping may be found, e.g., in "Laser-Induced Doping of GaAs," by Krautle, et al., Applied Physics A, Vol. 38, pp. 49-56 (1985) and "Laser Doping in Si, InP and GaAs," by Pokhmurska et al., Applied Surface Science, Vol. 154-155, pp. 712-715 (2000), each of which is incorporated herein by reference in its entirety.

Figure 7A:
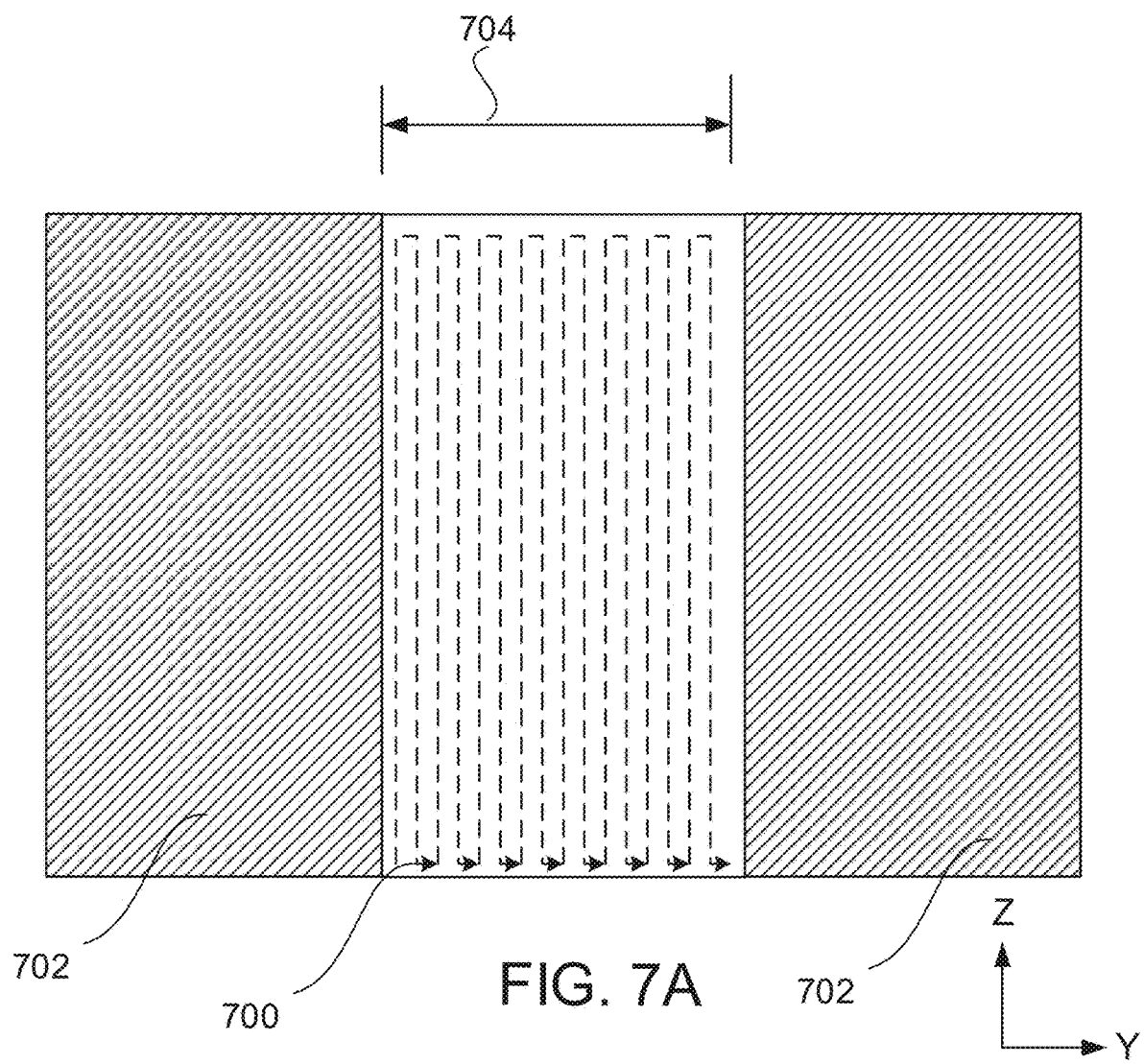
FIG. 7A is a schematic illustrating a top-view an example of a laser diode and an example of a laser path.

An example of the laser direct write process is shown in FIG. 7A. FIG. 7A is a schematic that illustrates a top view of an example of a laser diode and an example of a laser path 700 over the surface of the laser diode. In particular, the top view shown in FIG. 7A illustrates an exposed surface of a cap layer during the fabrication of a laser diode. As explained herein, the cap layer may be formed as an intrinsic (e.g., undoped) semiconductor layer. During the laser direct write process, the laser beam sweeps along path 700 at a steady rate. First, the beam sweeps longitudinally along the Z-axis toward a first end of the laser diode. During the sweep, the irradiation of the beam causes dopant molecules from the ambient gas to adsorb and diffuse into the cap layer. Once the beam reaches the end, the beam may be laterally translated to a new position along the Y-axis, where the beam again sweeps longitudinally toward a second end of the laser diode that is opposite the first end. This second track may run parallel to the first track. At the end of the second sweep, the beam may again be laterally translated to a new position along the Y-axis to begin yet another longitudinal sweep. In some implementations, the beam may be turned off during the lateral translations. The process may be repeated as many times as necessary until the laser has covered a predefined width corresponding to the desired emitter width 704. In some implementations, the beam is translated so that the beam spot overlaps with a previously irradiated region of the cap layer. The regions 702 that are not irradiated with the laser remain undoped.

Laser beam paths other than path 700 may be used to define the dopant profile within the cap layer. For example, in some implementations, the laser beam may be translated laterally (along the Y-axis) along a first track from one end of a predefined emitter window area to another opposite end of the predefined emitter window area, and then longitudinally displaced to begin a new lateral track.

Figure 7B:
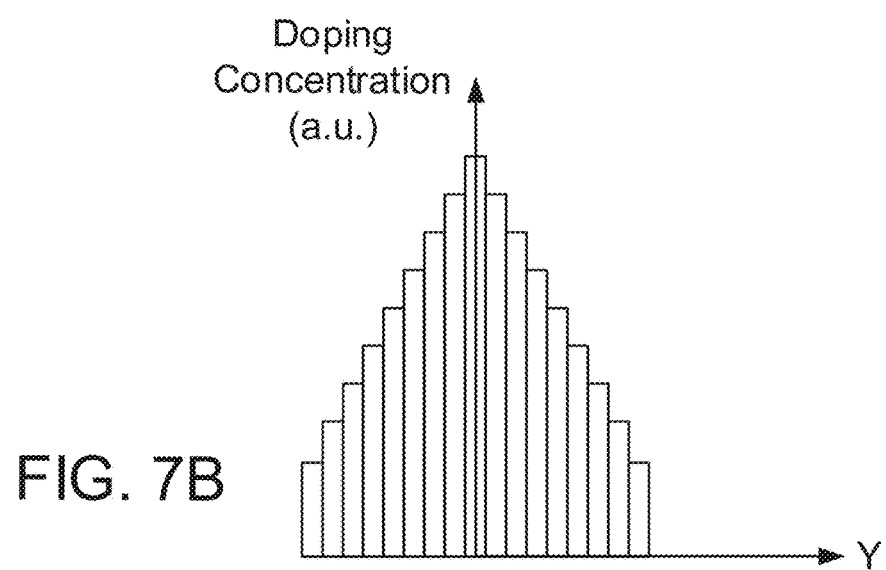
FIG. 7B is a plot illustrating an example of doping concentration across a laser diode resulting from laser doping.

FIG. 7B is a plot illustrating an example of a doping concentration along the width (Y-axis) of the laser diode that may result from the laser direct write process. Each bar represents the magnitude of doping concentration obtained within the cap layer along a longitudinally irradiated track. That is, the doping concentration within the cap layer is uniform along the longitudinal direction (Z-axis in FIG. 7A) but varies in the lateral direction (along the Y-axis). As shown in the plot, the doping concentration gradually increases toward the center of the laser diode. The change in doping concentration between each track may be obtained by altering the concentration of the dopant within the gas during irradiation, by altering the laser pulse duration, and/or by altering the laser beam intensity. Although the doping concentration is described above as being constant along the longitudinal direction (Z-axis), variations in dopant concentration also may be introduced along that direction as well.

During irradiation, the laser may have a beam spot diameter of at least 2 microns and less than the predefined width of the emitter window. For example, the laser can have a beam spot diameter of at least 3 microns, of at least 4 microns, of at least 5 microns, of at least 6 microns, of at least 8 microns, or of at least 10 microns.

In some implementations, the gradual lateral variation in doping profile may be obtained by performing ion implantation on the cap layer using a gray-scale mask. For instance, a resist mask may be formed on an upper surface of the cap layer in which the resist mask as a gradually varying thickness. In regions where the thickness of the resist mask is thinnest or non-existent, the dopant ions can penetrate into the semiconductor so that implantation results in high concentration within the cap layer. In regions where the resist mask is thicker, the mask serves to block implantation of some or all of the dopant molecules such that fewer dopant molecules are introduced into the cap layer.

Figure 7C:
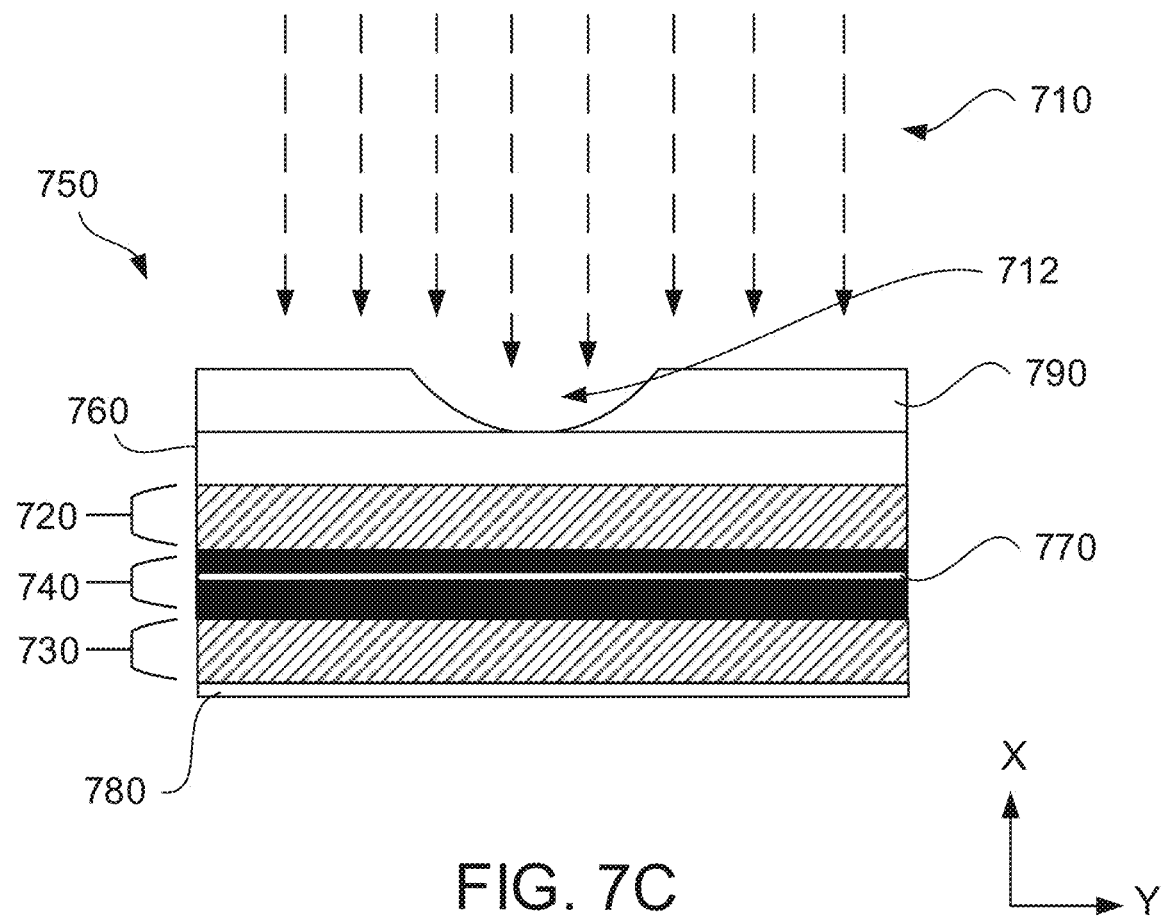
FIG. 7C is a schematic illustrating a cross-section of an example laser diode during fabrication of the laser diode.

FIG. 7C is a schematic illustrating a cross-section of an example laser diode 750 during fabrication of the laser diode using a gray-scale mask 790. As shown in FIG. 7C, a resist mask 790 is formed on an upper surface of a semiconductor cap layer 760. The semiconductor cap layer 760 is an intrinsic semiconductor layer formed on an upper surface of or a part of the first cladding region 720. As in the other examples disclosed herein, the laser diode 750 includes an optical waveguide region 740 having a gain layer 770, a second cladding region 730, and a substrate 780.

The resist layer 790 is exposed to incident light having an intensity that varies in the lateral and/or longitudinal directions by exposure of the resist through a second type of lithographical gray-scale mask. The lithographical gray-scale mask may be created by a laser lithography system. After absorbing the incident light, the resist layer 790 is developed leaving one or more regions 712 in which the resist material has been removed. In the example shown in FIG. 7C, the resist is partially removed to leave a concave region 712. After curing the resist, ion implantation doping 710 is performed. In regions where the resist is substantially thinned or removed altogether, the dopants pass through into the cap layer 760. As the resist thickens, fewer dopant molecules enter the cap layer resulting in the lateral variation in doping concentration, and thus in resistivity and current density during operation of the laser diode. Although the resist is described above as having just lateral variation in thickness, thickness variations along the longitudinal axis (Z-axis) also are possible.

In some implementations, laser radiation may be used to directly ablate resist from an initial uniform deposited photoresist layer to form a resist with desired thickness profile.

In some implementations, the lithographical gray-scale mask may be created using ion-beam or electron-beam lithography, in which the intensity of the beam is varied as a function of location, leading to different exposure depths within the resist.

Referring again to FIG. 6, after doping of the cap layer is completed, the top contact layer is deposited (614) on the cap layer. In some cases, the bottom contact layer also is formed at this time.

Figure 8:
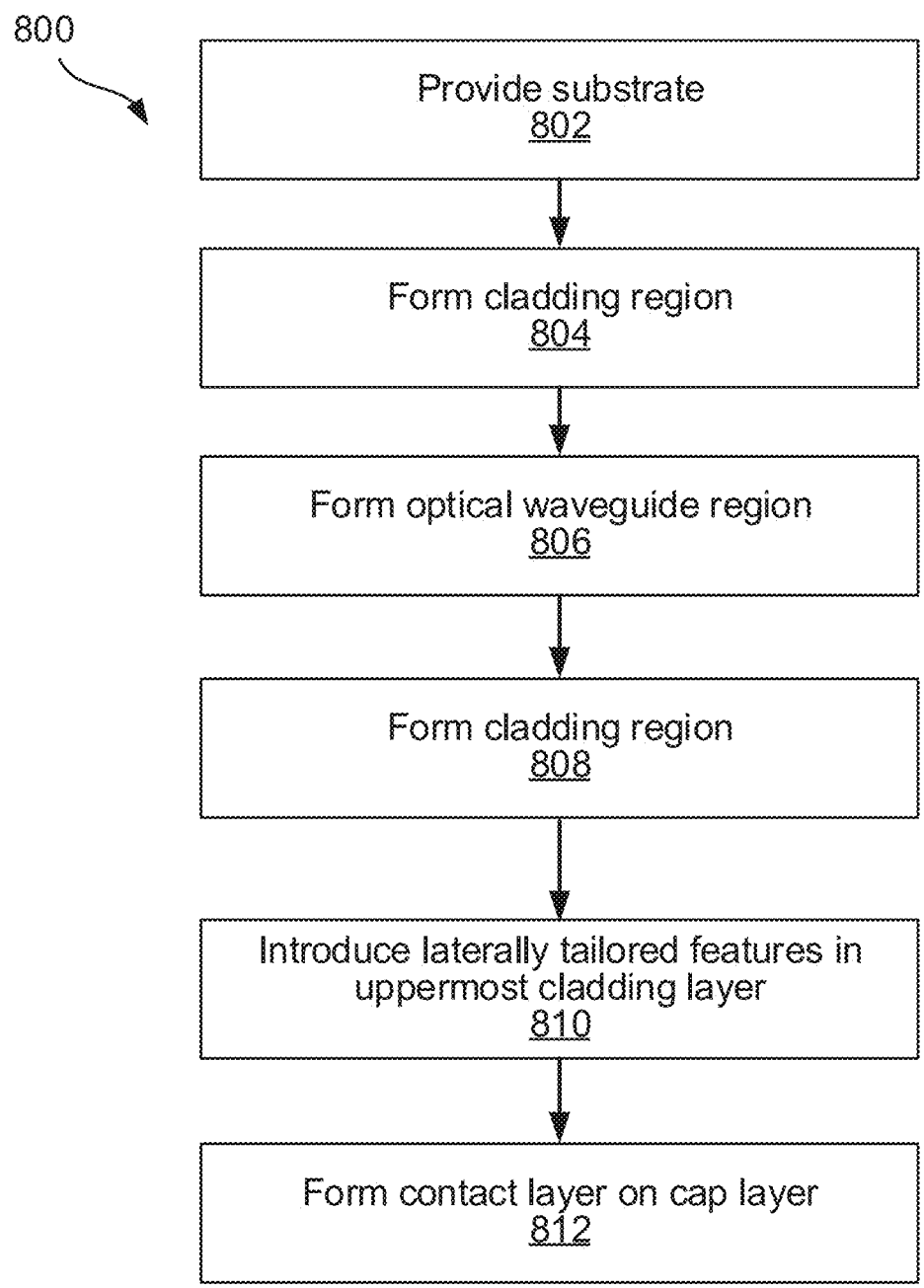
FIG. 8 is a flow chart depicting a fabrication process for a laser diode having a laterally tailored doping profile.

FIG. 8 is a flow chart depicting an exemplary fabrication process 800 for a laser diode having a laterally tailored built-in reverse bias potential, such as that disclosed with respect to FIGS. 5A-5B, or for a laser diode having a laterally tailored resistivity profile obtained using passivation by ion implantation.

Process steps 802-808 are similar to steps 602-608 and are not repeated here. The laterally varying features are introduced (810) into the uppermost semiconductor layer (e.g., the cap layer or the cladding region). This uppermost semiconductor layer may include a semiconductor layer of the first conductivity type (e.g., p-type) that is heavily doped (e.g., greater than $6 \times 10^{19}$ cm$^{-3}$).

Creation of the p-n junction within the semiconductor layer is achieved by introducing dopant molecules of the opposite conductivity type into the semiconductor layer. For example, if the semiconductor layer is a p-type GaAs semiconductor layer doped with carbon, an n-type dopant molecule (e.g., silicon) may be introduced into the semiconductor layer in substantial enough concentration to create an n-type region.

Figure 9:
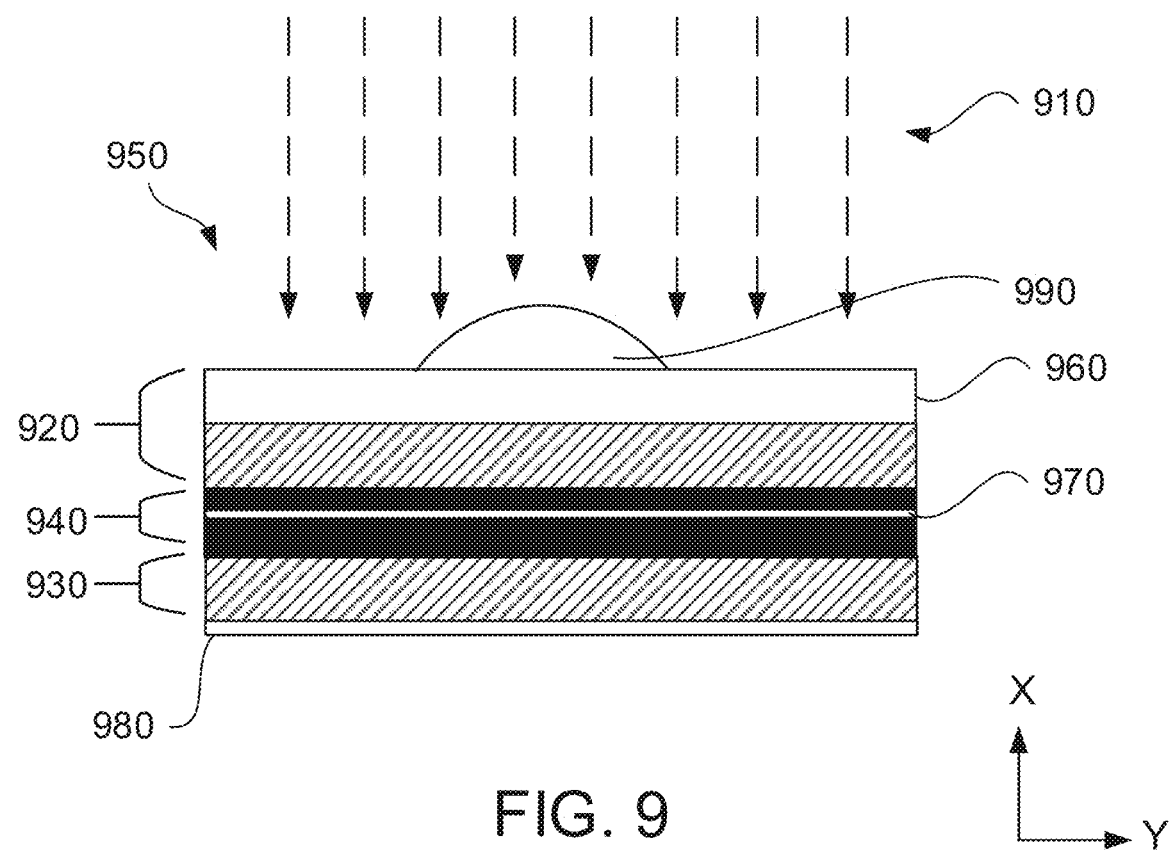
FIG. 9 is a schematic illustrating a cross-section of an example laser diode during fabrication of the laser diode.

The dopant molecules may be introduced, e.g., using ion implantation or direct laser writing. In the case of ion implantation, the tailoring of the dopant profile within the cladding layer may be defined using a gray-scale mask. FIG. 9 is a schematic illustrating a cross-section of an exemplary laser diode 950 during fabrication, in which a gray-scale mask is used. Laser diode 950 includes an uppermost semiconductor layer 960 of a first region 920 of a first conductivity type, an optical waveguide region 940 having a gain layer 970, and a second region 930 of a second conductivity type on a substrate 980. First, a resist layer is formed on the upper surface of the uppermost semiconductor layer 960. The resist then is exposed and reacts with light having a laterally and/or longitudinally varying intensity, after which the resist is developed and cured leaving a patterned resist layer 990.

In the example shown in FIG. 9, the patterned resist layer 990 has an approximately semi-circle profile that increases in thickness towards its middle. Accordingly, during the ion implantation process 910, dopant molecules are more easily incorporated into the uppermost semiconductor layer 960 in regions where the resist is absent or relatively thin. As the resist increases in thickness, fewer dopant molecules are able to penetrate the resist and enter the uppermost semiconductor layer, resulting in a laterally graded dopant profile, and the corresponding p-n junction having the laterally graded intrinsic electric field.

In cases where ion implantation passivation is performed instead, the second conductivity type dopant molecules are replaced with molecules that create localized disordered regions within the highly doped uppermost semiconductor layer 960, such as hydrogen or helium. Here, again, the patterned resist layer 990 may be used to inhibit the passivation molecules from entering the uppermost semiconductor layer 960 in certain areas while allowing the passivation molecules to enter into the uppermost semiconductor layer 960 in other areas. Although the fabrication processes described above refer to forming the gradually varying resistivity profiles within an uppermost semiconductor layer, the same processes and techniques may be used to form the gradually varying resistivity profiles and built-in reverse bias potentials in other layers of a laser diode device.

Figure 10:
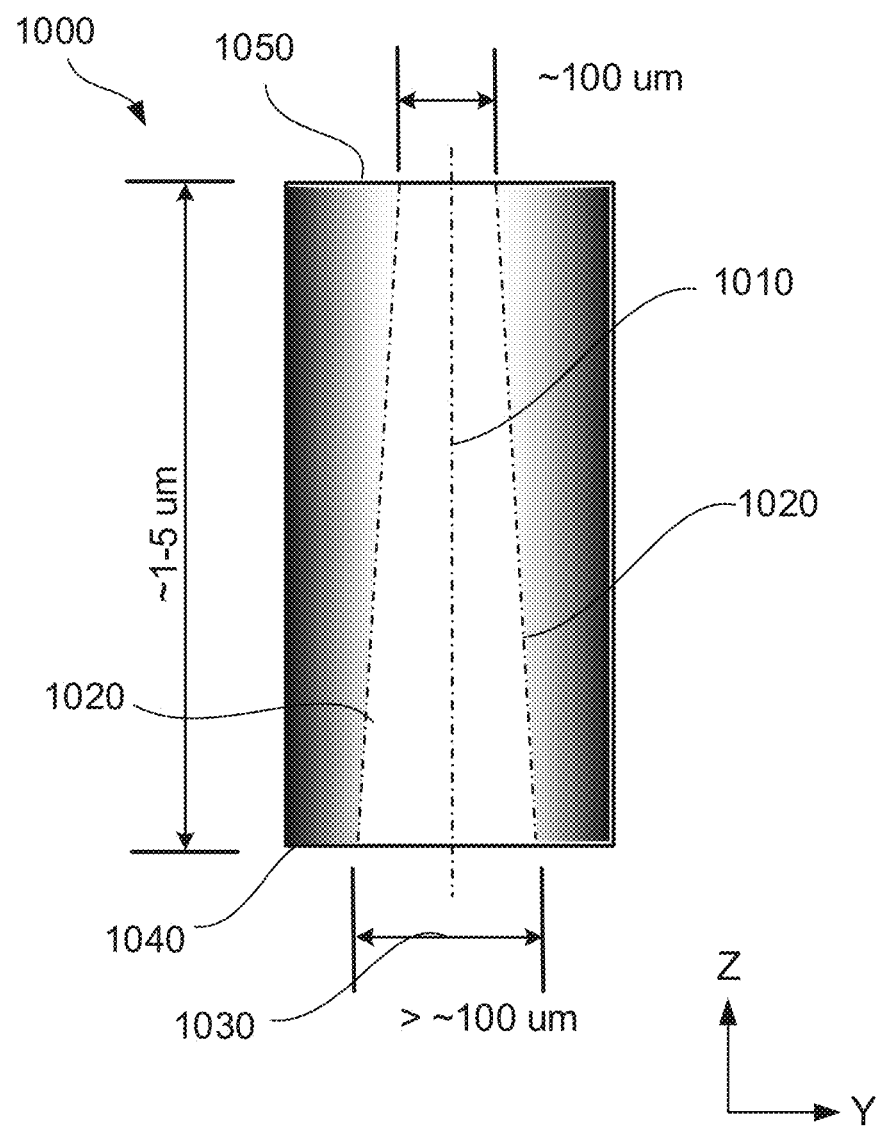
FIG. 10 is a schematic illustrating a top view of an example laser diode having a longitudinally tailored doping profile.

As explained herein, the gradually varying resistivity profiles may vary along the longitudinal direction as well. For instance, the variation in resistivity may occur along a direction that is parallel with the optical axis of the laser diode device. FIG. 10 is a schematic that illustrates a top view of an example of a laser diode device 1000. The structure of the device 1000, including the cladding regions, waveguide region and cap layer is the same as shown in FIG. 4A and is not illustrated here. A longitudinal axis 1010 extends along the Z-direction and is parallel with the optical axis of the laser diode device 1000. A gray-scale representation of the resistivity profile overlays the top surface of the laser diode device, in which increasing dark regions represent higher resistivity and lighter regions represent lower resistivity. Thus, the minimum resistivity in device 1000 is located along the axis 1010.

The effective width 1030 of the emitting region may correspond to the distance along the lateral direction (e.g., the Y-axis in FIG. 10) over which appreciable current flows, such that laser light is generated and emitted by the device 1000. In the example shown in FIG. 10, the effective width is represented by the distance between boundaries 1020. In some implementations, the effective width may be defined by a distance between the maximum resistivities along the lateral direction. As shown in FIG. 10, the effective width 1030 of the emitting region gradually varies from a first distance at a first facet 1040 of the laser diode device 1000 to a second distance at a second opposite facet 1050 of the laser diode device 1000, in which the second distance (approximately 100 microns) is less than the first distance (greater than 100 microns). The gradual variation of the effective width may occur the entire length of the device or may occur over some smaller length. For instance, the gradual variation between the effective widths may occur over 5 microns, 10 microns, 50 microns, 100 microns, 500 microns, 1000 microns, 2500 microns, or 5000 microns, among other distances.

Although the example shown in FIG. 10 illustrates a generally linear change in the effective width along the longitudinal direction, the change in effective width of the emitting region may vary non-linearly including, e.g., a parabolic, an exponential or any other monotonic variation in effective width. In some cases, the variation in resistivity profile along the longitudinal direction has a profile that is similar to the profiles described above with respect to FIGS. 4 and 5.

OTHER EMBODIMENTS

It is to be understood that while the invention has been described in conjunction with the detailed description thereof, the foregoing description is intended to illustrate and not limit the scope of the invention, which is defined by the scope of the appended claims. For example, in some implementations, the gradual variation in resistivity profile may be achieved by gradually varying the thickness of the insulating layer between the semiconductor layers and the contact layer of the laser diode device. For instance, using the gray-mask layers described herein, such as mask layer 790 in FIG. 7C, an insulating layer located on a top surface of the semiconductor layers may be etched such that it exhibits a gradually varying thickness profile, where the thickness of the insulating layer goes from zero near a center of the laser diode device to some non-zero thickness toward edges of the device (e.g., along a lateral direction). A metal contact layer then may be formed on the gradually varying insulating layer such that it makes direct contact with the semiconductor layer beneath in the region where the insulating layer thickness is zero, and is prevented from making contact with the semiconductor where the insulating thickness is non-zero. Due to the gradual variation in insulating layer thickness, the resistivity profile, and thus current density through the device when operated, will exhibit a similar variation as shown in FIG. 3A. The parameters associated with the resistivity profile for the device, such as effective width of the emitting region and maximum and minimum resistivities may vary as described with respect to the other examples disclosed herein.

In some implementations, higher order modes of the laser diode can be suppressed by combining the gradual conductivity profile, as described herein, with conventional index guiding, such as index ridges or trenches on the, which may be formed by etching, or by fabricating multiple layers of alternating refractive index material.

In some implementations, the laser devices described herein and encompassed by the present disclosure may be incorporated into laser arrays. For example, multiple laser diode devices may be formed laterally adjacent to one another as part of a laser array, in which each of the laser diode devices exhibits a gradually varying resistivity profile as described herein.

Other aspects, advantages, and modifications are within the scope of the following claims.

What is claimed is:
1. A semiconductor laser diode comprising a plurality of layers stacked along a first direction, wherein the plurality of layers comprises:
   a first plurality of semiconductor layers;
   an optical waveguide on the first plurality of semiconductor layers, wherein the optical waveguide comprises a semiconductor active region for generating laser light, and wherein the optical waveguide defines a resonant cavity having an optical axis; and
   a second plurality of semiconductor layers on the optical waveguide region,
      wherein a resistivity profile of at least one layer of the plurality of layers varies gradually between a maximum resistivity and a minimum resistivity along a second direction extending orthogonal to the first direction, wherein a distance between the maximum resistivity and the minimum resistivity is greater than at least about 2 microns.

2. The semiconductor laser diode of claim 1, wherein the minimum resistivity is centered along the second direction and gradually increases along the second direction toward the maximum resistivity near an edge of the semiconductor laser diode.

3. The semiconductor laser diode of claim 2, wherein the resistivity of the at least one layer is symmetric about the first direction.

4. The semiconductor laser diode of claim 1, wherein the second direction is orthogonal to the optical axis.

5. The semiconductor laser diode of claim 1, wherein the second direction extends along the optical axis.

6. The semiconductor laser diode of claim 1, wherein the first plurality of semiconductor layers comprises:
   a first semiconductor cap layer on the first contact layer; and
   a first semiconductor cladding region on the first semiconductor cap layer, wherein the second plurality of semiconductor layers comprises:
   a second semiconductor cladding region on the optical waveguide region; and
   a second semiconductor cap layer on the second semiconductor cladding region, and
   wherein the at least one semiconductor layer from the first plurality of semiconductor layers and/or from the second plurality of semiconductor layers exhibits the resistivity profile.

7. The semiconductor laser diode of claim 1, wherein the at least one layer having the resistivity profile is in the first plurality of semiconductor layers,
   wherein at least one layer in the second plurality of semiconductor layers exhibits an additional resistivity profile that varies gradually between a maximum resistivity and a minimum resistivity along the second direction, and
   wherein a distance between the maximum resistivity of the additional resistivity profile and the minimum resistivity of the additional resistivity profile is greater than at least about 2 microns.

8. The semiconductor laser diode of claim 7, wherein the resistivity profile of the at least one layer in the first plurality of semiconductor layers extends no more than 10 microns from the first contact layer.

9. The semiconductor laser diode of claim 1, wherein the distance between the maximum resistivity and the minimum resistivity gradually decreases from a first value at a first facet of the semiconductor laser diode to a second lower value at a second facet of the semiconductor laser diode, the second facet being at an opposite end of the semiconductor laser diode from the first facet.

10. The semiconductor laser diode of claim 1, wherein the active region comprises at least one quantum well.

11. The semiconductor laser diode of claim 1, wherein the first plurality of semiconductor layers and the second plurality of semiconductor layers comprise III-V semiconductor compounds.

12. The semiconductor laser diode of claim 1, wherein the first plurality of semiconductor layers and the second plurality of semiconductor layers comprise II-VI semiconductor compounds.

13. The semiconductor laser diode of claim 1, wherein a difference between the maximum resistivity and the minimum resistivity is at least 1% of the minimum resistivity.

14. A method of fabricating a semiconductor laser diode, the method comprising:
    forming a plurality of laser diode layers stacked along a first direction, the plurality of laser diode layers comprising a first plurality of semiconductor layers, an optical waveguide on the first plurality of semiconductor layers, and a second plurality of semiconductor layers on the optical waveguide, the optical waveguide defining a resonant cavity having an optical axis and comprising a semiconductor active region for generating laser light,
    wherein forming the plurality of laser diode layers comprises modifying a first semiconductor layer of the plurality of laser diode layers to have a resistivity profile that varies gradually between a maximum resistivity and a minimum resistivity along a second direction extending orthogonal to the first direction, wherein a distance between the maximum resistivity and the minimum resistivity is greater than at least about 2 microns.

15. The method of claim 14, wherein modifying the first semiconductor layer comprises implanting the first semiconductor layer with a varying concentration of dopant along the second direction to provide a doped first semiconductor layer that exhibits the resistivity profile.

16. The method of claim 15, wherein implanting the first semiconductor layer with the varying concentration of dopant comprises applying laser radiation to the first semiconductor layer.

17. The method of claim 16, wherein applying laser radiation comprises using a laser direct write process.

18. The method of claim 17, wherein applying laser radiation comprises performing a raster scan over a surface of the first semiconductor layer with the laser radiation.

19. The method of claim 18, wherein performing the raster scan comprises irradiating the surface of the first semiconductor layer along a plurality of parallel tracks.

20. The method of claim 15, wherein implanting the first semiconductor layer with a dopant comprises performing ion implantation on the first semiconductor layer.

21. The method of claim 20, wherein modifying the first semiconductor layer further comprises:
    forming a gradually varying gray-scale mask layer on a surface of the first semiconductor layer prior to performing ion implantation; and
    performing ion implantation through the gray-scale mask layer, wherein a thickness or density of the gray-scale mask layer controls a local doping level within the first semiconductor layer.

22. The method of claim 21, wherein the gray-scale mask layer comprises a patterned photoresist layer.

23. The method of claim 21, wherein forming the gray-scale mask layer comprises:
    forming a photoresist layer on the first semiconductor layer;
    exposing the photoresist layer to radiation through a gray-scale lithography mask that locally defines a level of exposure of the photoresist; and
    applying a developer to the exposed photoresist layer to form the gray-scale mask layer.

24. The method of claim 21, wherein forming the gray-scale mask layer comprises:
    forming a photoresist layer on the first semiconductor layer; and
    applying laser radiation to the photoresist layer to define the gray-scale mask layer.

25. The method of claim 14, wherein modifying the first semiconductor layer comprises:

implanting the first semiconductor layer with a dopant such that a conductivity within a predefined region of the first semiconductor layer changes from a first conductivity type to a second conductivity type, wherein an electric field is established within the first semiconductor layer due to a difference in conductivity type between the predefined region and other regions of the first semiconductor layer, wherein a profile of the electric field along the lateral direction varies gradually along the second direction so that, during operation of the laser diode device, the first semiconductor layer exhibits the resistivity profile.

26. The method of claim 25, wherein implanting the first semiconductor layer with a dopant comprises performing ion implantation on the first semiconductor layer.

27. The method of claim 26, wherein performing ion implantation comprises:

forming a gray-scale mask layer on a surface of the first semiconductor layer to block ions on prior to performing ion implantation; and performing the ion implantation through the gray-scale mask layer, wherein a thickness or density of the gray-scale mask layer controls a local doping level within the first semiconductor layer.

28. The method of claim 14, wherein modifying the first semiconductor layer comprises:

performing ion implantation on the first semiconductor layer to provide a passivated region that exhibit the resistivity profile.

29. The method of claim 28, wherein performing ion implantation comprises bombarding the first semiconductor layer with hydrogen or helium ions.

\* \* \* \* \*